US012701979B2

(12) United States Patent
Lee et al.

(10) Patent No.: US 12,701,979 B2
(45) Date of Patent: Aug. 4, 2026

(54) INTERCONNECTION STRUCTURE AND METHOD FOR FORMING THE SAME

(71) Applicant: TAIWAN SEMICONDUCTOR MANUFACTURING COMPANY, LTD., Hsinchu (TW)

(72) Inventors: Ming-Feng Lee, Chiayi County (TW); Wei-Ting Chen, Tainan City (TW); Chen-Chung Lai, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 414 days.

(21) Appl. No.: 18/355,268

(22) Filed: Jul. 19, 2023

(65) Prior Publication Data

US 2025/0029870 A1     Jan. 23, 2025

(51) Int. Cl.
*H10W 20/00* (2026.01)
*H10W 20/42* (2026.01)
*H10P 50/28* (2026.01)

(52) U.S. Cl.
CPC ......... *H10W 20/082* (2026.01); *H10W 20/42* (2026.01); *H10P 50/283* (2026.01)

(58) Field of Classification Search
CPC . H10W 20/081; H10W 20/088; H10W 20/42; H10W 20/422; H10P 50/283
See application file for complete search history.

(56) References Cited

U.S. PATENT DOCUMENTS 11,361,971 B2 * 6/2022 Chang ................... H10P 50/244

* cited by examiner

*Primary Examiner* — Thanhha S Pham
(74) *Attorney, Agent, or Firm* — Birch, Stewart, Kolasch & Birch, LLP

(57) ABSTRACT

A method for forming an interconnection structure includes depositing a dielectric layer over a first interconnect layer, wherein the first interconnect layer comprises a first metallization layer; forming a via opening in the dielectric layer, and forming a conductive via in the via opening. Forming the via opening includes: etching a recess in the dielectric layer above the first metallization layer; etching a first lateral recess in the dielectric layer at a sidewall of the recess; and after etching the first lateral recess, etching the recess downward to expose the first metallization layer.

20 Claims, 21 Drawing Sheets

PR

HM

222

210 { 212
Mx

110

INTERCONNECTION STRUCTURE AND METHOD FOR FORMING THE SAME

BACKGROUND

The semiconductor integrated circuit (IC) industry has experienced rapid growth in the past several decades. Technological advances in semiconductor materials and design have produced increasingly smaller and more complex circuits. These material and design advances have been made possible as the technologies related to processing and manufacturing have also undergone technical advances. As a size of the smallest component has decreased, numerous challenges have risen. For example, interconnection of conductive lines and associated dielectric materials that facilitate wiring between the transistors and other devices play a role in IC performance improvement.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
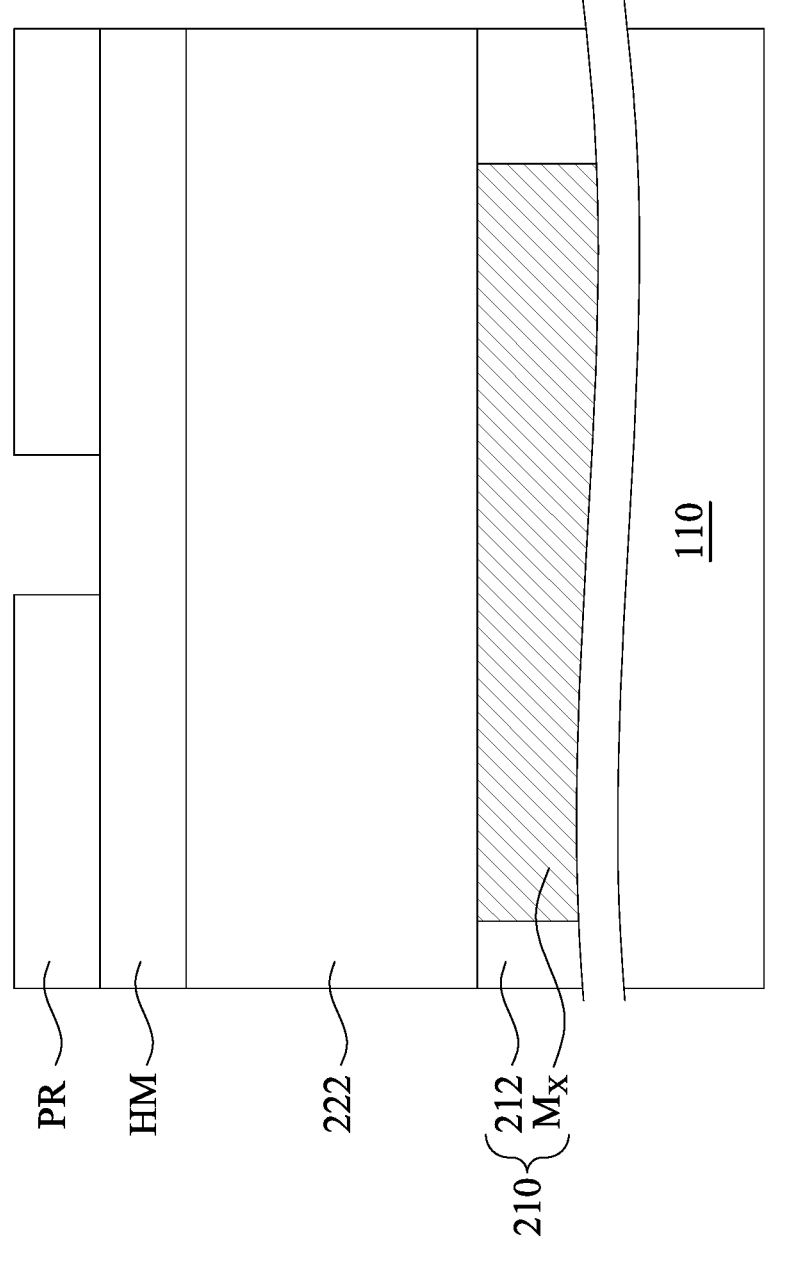
FIGS. 1 to 15 are cross-sectional views of intermediate stages in the formation of an interconnection structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 to 14 are cross-sectional views of intermediate stages in the formation of an interconnection structure according to some embodiments of the present disclosure. It is understood that additional steps may be provided before, during, and after the steps shown in FIGS. 1 to 14, and some of the steps described below can be replaced or eliminated for additional embodiments of the method. The order of the operations/processes may be interchangeable.

Reference is made to FIG. 1. An interconnect layer 210 is formed over a substrate 110. The substrate 110 may be a silicon substrate. Alternatively, the substrate 110 may include another elementary semiconductor, such as germanium; a compound semiconductor including silicon carbide; an alloy semiconductor including silicon germanium; or combinations thereof. In some embodiments, the substrate 110 is a semiconductor on insulator (SOI) substrate. The substrate 110 may include doped regions, such as p-wells and n-wells. Active devices or passive devices may be formed over the substrate 110 by suitable transistor fabrication processes. For example, a planar transistor, such as polysilicon gate transistors or high-k metal gate transistors, or a multi-gate transistor, such as fin field effect transistors, are formed over the substrate.

After the transistors are formed, the interconnect layer 210 including a metallization layer $M_x$ and a dielectric layer 212 is formed over the transistors. Formation of the interconnect layer 210 include depositing the dielectric layer 212 over the substrate 110, etching trenches in the dielectric layer 212, depositing a conductive material into the trenches, followed by a planarization process (e.g., chemical mechanical polish (CMP) process) to remove an excess portion of the conductive material outside the trenches. Remaining portions of the conductive material serve as the metallization layer $M_x$.

The dielectric layer 212 may include suitable dielectric materials, such as tetrathoxysilane (TEOS), an extreme low-k (ELK) dielectric material, nitrogen-free anti-reflective coating (NFARC), silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), Xerogel, Aerogel, amorphous fluorinated carbon, parylene, BCB (bis-benzocyclobutenes), polyimide, or any combination thereof. The ELK dielectric material has a dielectric constant less than, for example, about 2.5. It is understood that the dielectric layer 212 may include one or more dielectric materials and/or one or more dielectric layers. In some embodiments, the dielectric layer 212 may be deposited by chemical vapor deposition (CVD), high density plasma (HDP) CVD, sub-atmospheric CVD (SACVD), spin-on coating, sputtering, or other suitable techniques.

In some embodiments, the metallization layer $M_x$ includes conductive lines extending horizontally in the dielectric layer 212. The conductive material of the metallization layer $M_x$ may be copper, although other materials, such as tungsten, aluminum, gold, or the like, can alternatively be utilized. The conductive material of the metallization layer $M_x$ may can be deposited by suitable physical vapor deposition process, electroplating techniques, the like, or the combination thereof.

A dielectric layer 222 may be deposited over the interconnect layer 210. The dielectric layer 222 may include suitable dielectric materials, such as TEOS, an extreme low-k (ELK) dielectric material, NFARC, silicon oxide, silicon nitride, silicon oxynitride, PSG, BPSG, SOG, FSG, carbon doped silicon oxide (e.g., SiCOH), Xerogel, Aerogel, amorphous fluorinated carbon, parylene, BCB, polyimide, or any combination thereof. The ELK dielectric material has a dielectric constant less than, for example, about 2.5. The dielectric layer 222 may include the same or different dielectric materials. It is understood that the dielectric layer 222 may include one or more dielectric materials and/or one or more dielectric layers. In some embodiments, the dielectric layer 222 may be deposited by CVD, HDP CVD, SACVD, spin-on coating, sputtering, or other suitable techniques.

Figure 2:
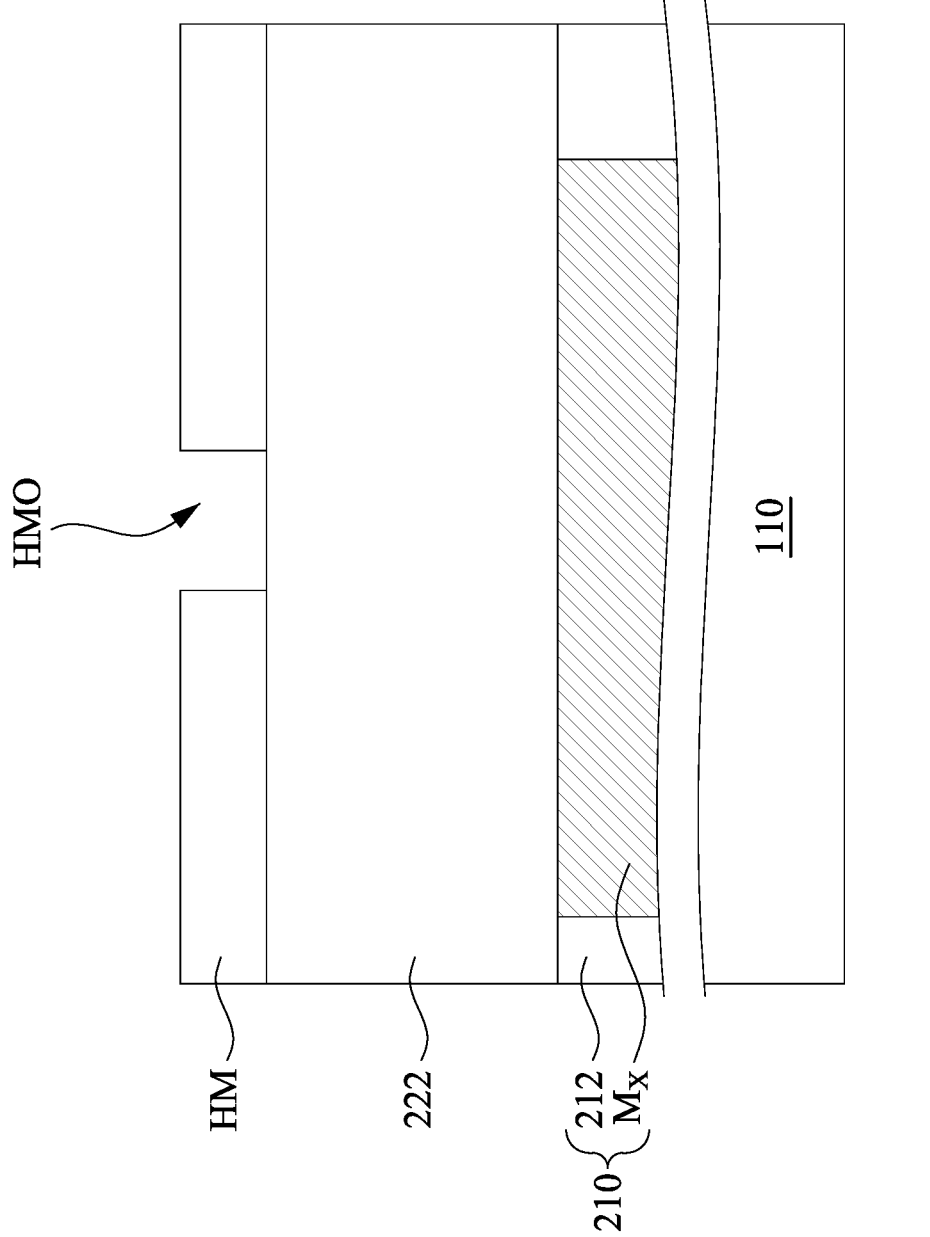

A hard mask layer HM is deposited over the dielectric layer 222. The hard mask layer HM may include a dielectric material different from that of the dielectric layer 222. For example, the hard mask layer HM may include silicon nitride, silicon nitride, silicon carbide, high-k dielectric, the like, or the combination thereof. A photoresist layer PR is formed over the hard mask layer HM by photolithography process. The photolithography process may include coating a photoresist layer (not shown), exposing the photoresist layer to a pattern, performing post-exposure bake processes, and developing the photoresist layer to form a patterned photoresist mask. The hard mask layer HM is patterned to have an opening HMO exposing the underlying dielectric layer 222 by suitable etching process using the photoresist layer PR as an etch mask, as illustrated in FIG. 2.

FIGS. 3-11 illustrates the formation of a skew-like via opening in the dielectric layer 222. The formation of the skew-like via opening may include in the cyclic repetition of anisotropic dry etching with substrate bias and isotropic dry etching with little or no substrate bias in the same plasma etching apparatus. For example, the plasma etching apparatus may be a reactive ion etcher (RIE), an inductively coupled plasma (ICP), or other suitable etchers. The plasma etching apparatus may use a suitable plasma (e.g., chlorine-containing plasmas) for the anisotropic dry etching and the isotropic dry etching. For example, $Cl_2$ gas may be used for generating the chlorine-containing plasmas. The plasma has a higher etch rate to the dielectric layer 222 than to the hard mask layer HM, and thus the hard mask layer HM may serve as an etch mask in the cyclic repetition of anisotropic etching and isotropic etching. The plasma etching apparatus may include a radio frequency (RF) power source for biasing the substrate. By adjusting the power of the RF power source, the cyclic repetition of anisotropic dry etching and the isotropic dry etching can be achieved.

Figure 3:
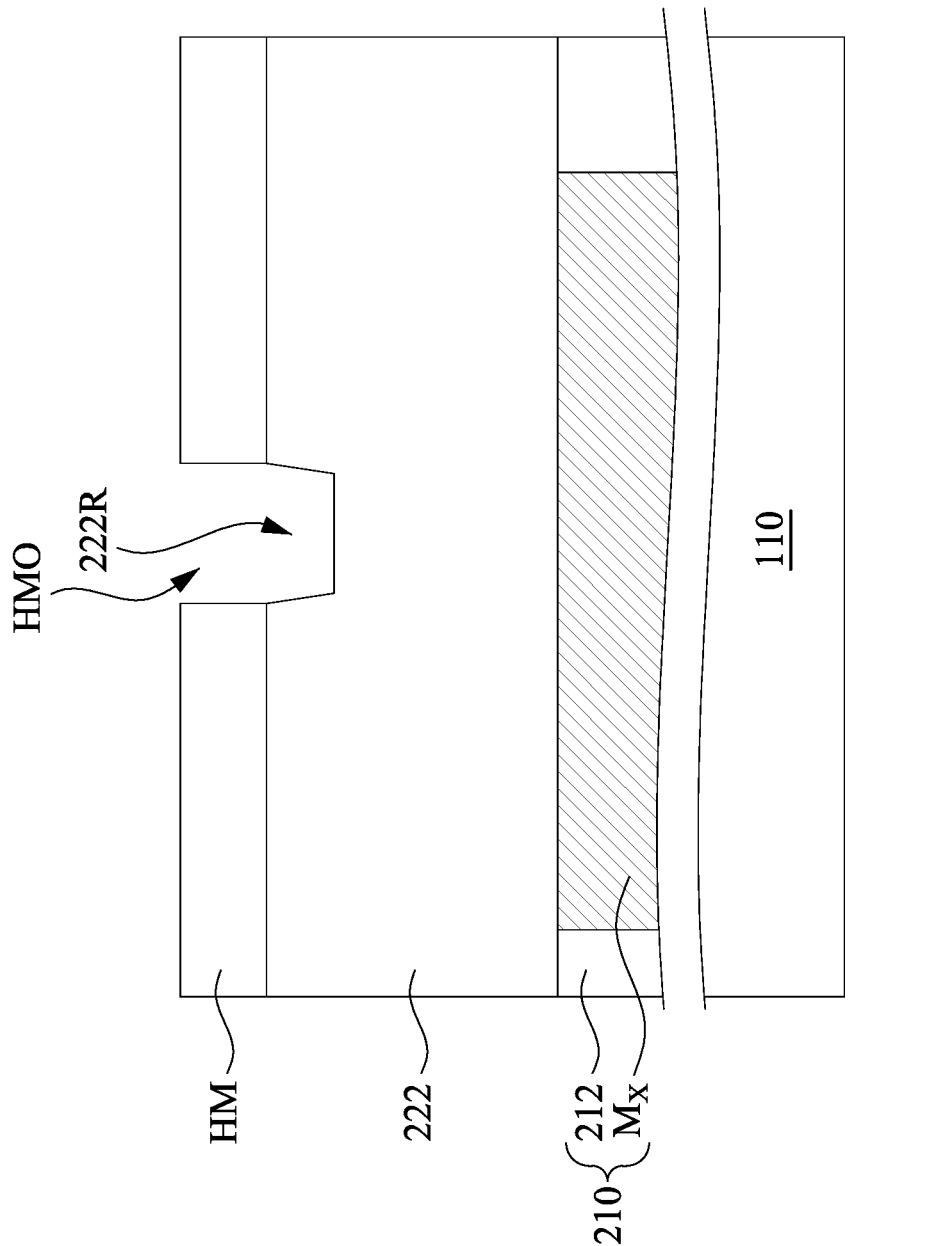

Reference is made to FIG. 3. A recess 222R is vertically etched in the dielectric layer 222 above the metallization layer $M_x$ using the hard mask layer HM as an etch mask. In some embodiments, the vertical etching of the recess 222R may include a plasma anisotropic etching process with substrate bias. The plasma anisotropic etching process may include the process of removing materials of the dielectric layer 222 by exposing the dielectric layer 222 to an ion bombardment. Ions in plasma are accelerated by the substrate bias for obtaining suitable energy for bombarding the surfaces of the dielectric layer 222 (e.g., the bottom of the recess 222R). In some embodiments, ion bombardment precipitates ions at the bottom of the recess 222R because of high electric field resulting from the substrate bias. Stated differently, the plasma ions and the substrate bias result in a synergistic effect in collecting more ions at a lower region of the recess 222R than at an upper region of the recess 222R.

Figure 4A:
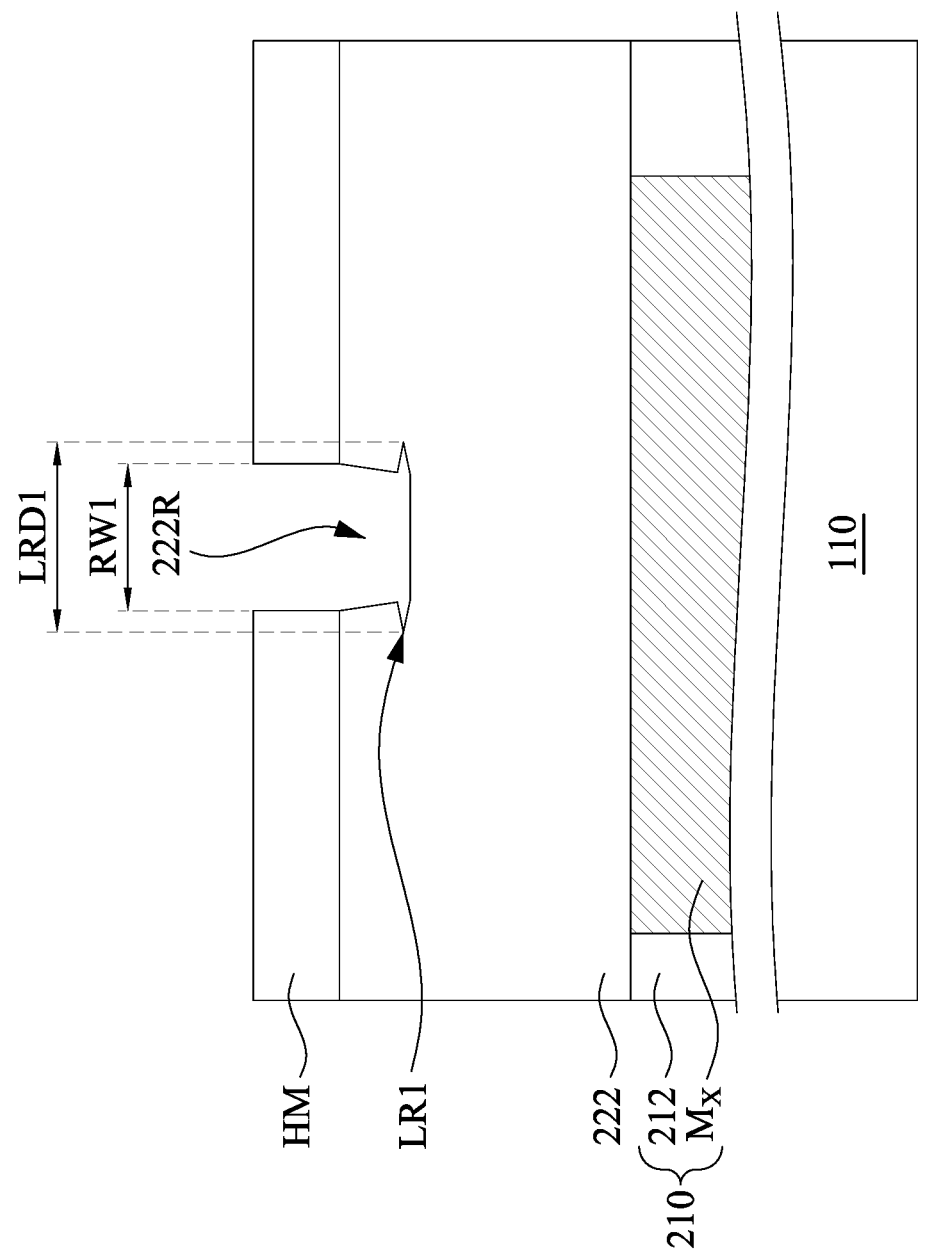
Figure 4B:
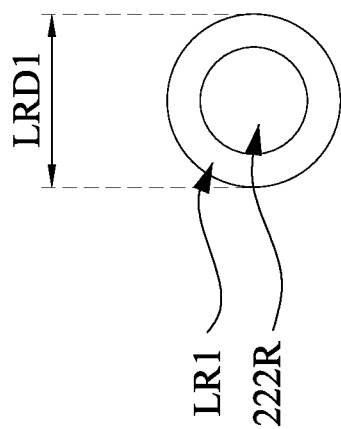

Reference is made to FIG. 4A. After the vertical etching of the recess 222R (referring FIG. 3), a lateral recess LR1 is laterally etched on a sidewall of the recess 222R. In some embodiments, the lateral etching of the lateral recess LR1 may include a plasma isotropic etching process without substrate bias. This process can be performed in-situ immediately following the plasma anisotropic etching process depicted in FIG. 3, which in turn allows the plasma isotropic etching process to be benefited from the non-uniform ion distribution caused by the previous plasma anisotropic etching process. In greater detail, because the lower region of the recess 222R has more ions than the upper region of the recess 222R as a consequence of the ion bombardment in the vertically etching of the recess 222R (referring to FIG. 3), the lateral recess LR1 is etched at a lower region of a sidewall of the recess 222R by plasma, rather than at an upper region of the sidewall of the recess. In this way, the plasma isotropic etching process can etch the lower region of the sidewall of the recess 222R at a faster etch rate than etching the upper region of the sidewall of the recess 222R, which in turn results in a greater etching amount in the lower region of the sidewall of the recess 222R than in the upper region of the sidewall of the recess 222R. As a result, the lateral recess LR1 may be localized to the lower region of the sidewall of the recess 222R, and the upper region of the sidewall of the recess 222R may be free of any lateral recess. The lateral recess LR1 may laterally encircle the recess 222R. FIG. 4B illustrates a plane view of FIG. 4A at the level of the lateral recess LR1. The lateral recess LR1 may have an annular shape around the recess 222R. In some embodiments, the lateral recess LR1 may extend into the dielectric layer 222 beyond a top width of the recess 222R. For example, a greatest lateral dimension/length LRD1 of the annular shape of the lateral recess LR1 is greater than a top width RW1 of the recess 222R. After the lateral etching of the lateral recess LR, the metallization layer $M_x$ remains covered by the dielectric layer 222. The recess 222R may also be slightly expanded by the plasma isotropic etching process in the lateral etching of the lateral recess LR1. For example, a size/width of the recess 222R (e.g., the top width RW1) may get increased after the lateral etching of the lateral recess LR1.

Figure 5:
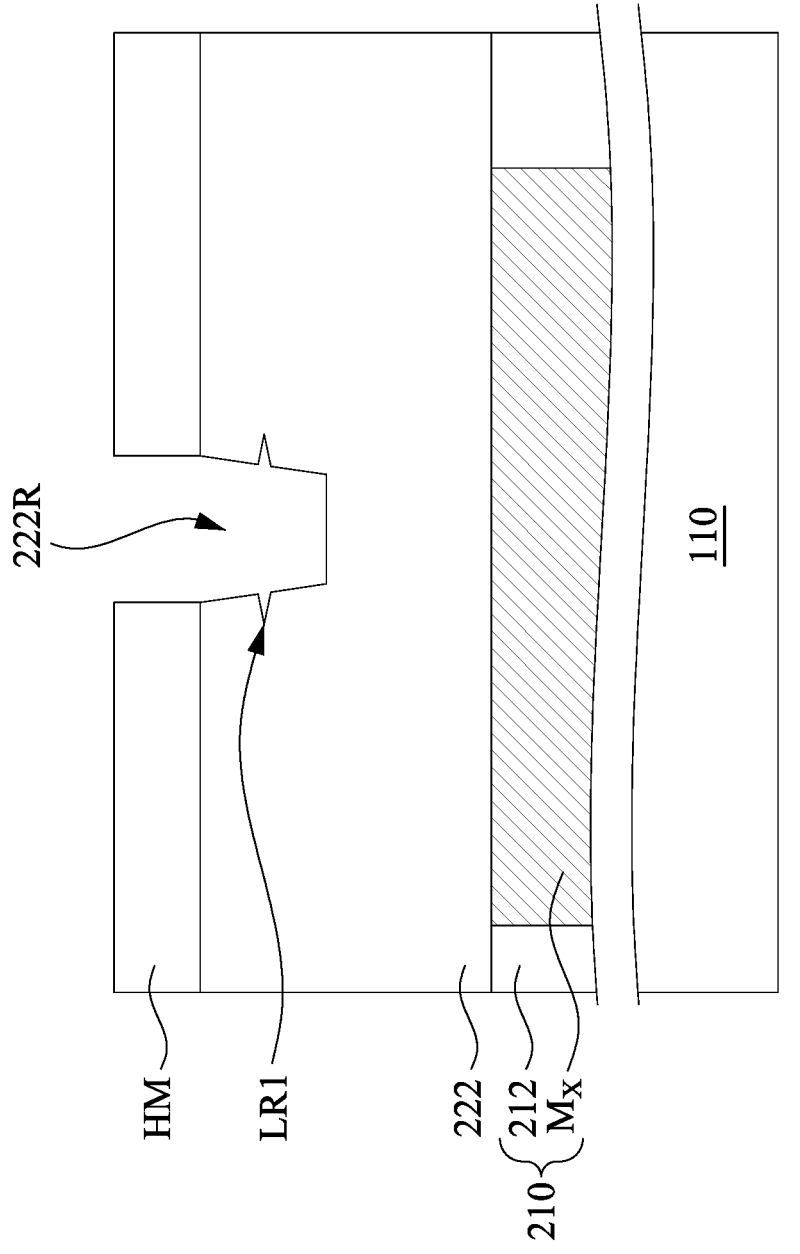

Reference is made to FIG. 5. The recess 222R in FIG. 4A is vertically etched downward in the dielectric layer 222 to a first level higher than a top surface of the metallization layer $M_x$. The vertical downward etching may use the hard mask layer HM as an etch mask. In some embodiments, the vertical downward etching of the recess 222R may include an in-situ plasma anisotropic etching process with substrate bias. The plasma anisotropic etching process may include the process of removing materials of the dielectric layer 222 by exposing the dielectric layer 222 to an ion bombardment. As aforementioned, ion bombardment precipitates ions at the bottom of the recess 222R because of high electric field resulting from the substrate bias. Stated differently, the plasma ions and the substrate bias result in a synergistic effect in collecting more ions at a lower region of the recess 222R than at an upper region of the recess 222R.Reference is made to FIG. 6. After the vertical etching of the recess 222R (referring FIG. 5), a lateral recess LR2 is laterally etched on a sidewall of the recess 222R and at a position lower than the lateral recess LR1. In some embodiments, the lateral etching of the lateral recess LR2 may include a plasma isotropic etching process without substrate bias. This process can be performed in-situ immediately following the plasma anisotropic etching process depicted in FIG. 5, which in turn allows the plasma isotropic etching process to be benefited from the non-uniform ion distribution caused by the previous plasma anisotropic etching process. In greater detail, because the lower region of the recess 222R has more ions than the upper region of the recess 222R as a consequence of the ion bombardment in the vertically etching of the recess 222R (referring to FIG. 5), the lateral recess LR2 is etched at a lower region of a sidewall of the recess 222R by plasma, rather than at an upper region of the sidewall of the recess. In this way, the plasma isotropic etching process can etch the lower region of the sidewall of the recess 222R at a faster etch rate than etching the upper region of the sidewall of the recess 222R, which in turn results in a greater etching amount in the lower region of the sidewall of the recess 222R than in the upper region of the sidewall of the recess 222R. As a result, the lateral recess LR2 may be localized to the lower region of the sidewall of the recess 222R. The lateral recess LR2 may laterally encircle the recess 222R. As the lateral recess LR1 in FIG. 4B, the lateral recess LR2 may have an annular shape around the recess 222R in a plane view. In some embodiments, the lateral recess LR2 may extend into the dielectric layer 222 beyond a top width of the recess 222R. For example, a greatest lateral dimension/length LRD2 of the annular shape of the lateral recess LR2 is greater than a top width RW1 of the recess 222R. After the lateral etching of the lateral recess LR2, the metallization layer M$_x$ remains covered by the dielectric layer 222. The recess 222R (e.g., top width RW1) may also be slightly expanded by the plasma isotropic etching process in the lateral etching of the lateral recess LR2, and the lateral recess LR1 may also be further laterally deepen by the plasma isotropic etching process in the lateral etching of the lateral recess LR2. For example, a size/width of the recess 222R (e.g., the top width RW1) and the greatest lateral dimension/length LRD1 of the lateral recess LR1 (referring to FIG. 4A) may get increased after the lateral etching of the lateral recess LR2.

Figure 6:
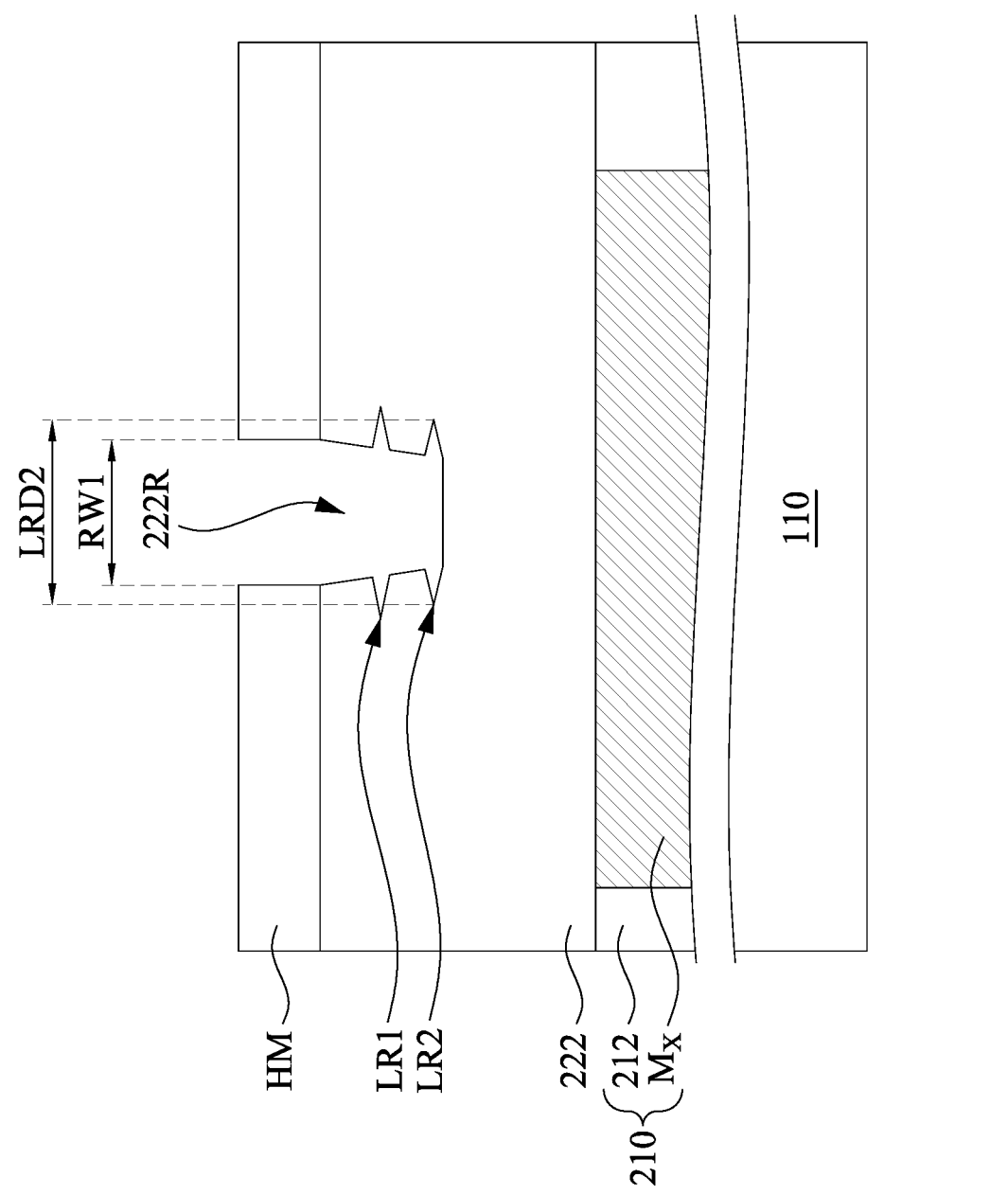
Figure 7:
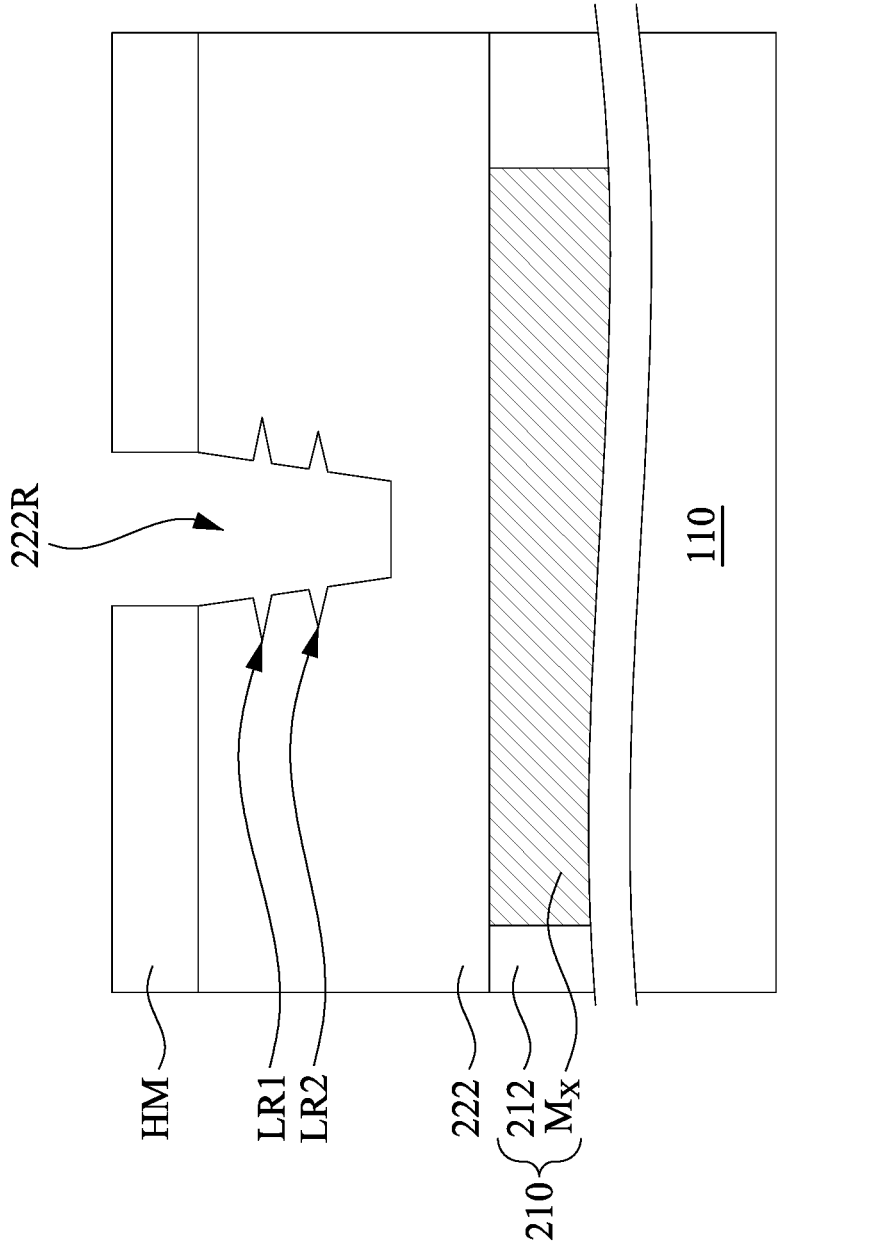

Reference is made to FIG. 7. The recess 222R in FIG. 6 is vertically etched downward in the dielectric layer 222 to a second level lower than the first level in FIG. 5 but higher than the top surface of the metallization layer M$_x$. The vertical downward etching may use the hard mask layer HM as an etch mask. In some embodiments, the vertical downward etching of the recess 222R may include an in-situ plasma anisotropic etching process with substrate bias. The plasma anisotropic etching process may include the process of removing materials of the dielectric layer 222 by exposing the dielectric layer 222 to an ion bombardment. As aforementioned, ion bombardment precipitates ions at the bottom of the recess 222R because of high electric field resulting from the substrate bias. Stated differently, the plasma ions and the substrate bias result in a synergistic effect in collecting more ions at a lower region of the recess 222R than at an upper region of the recess 222R.

Figure 8:
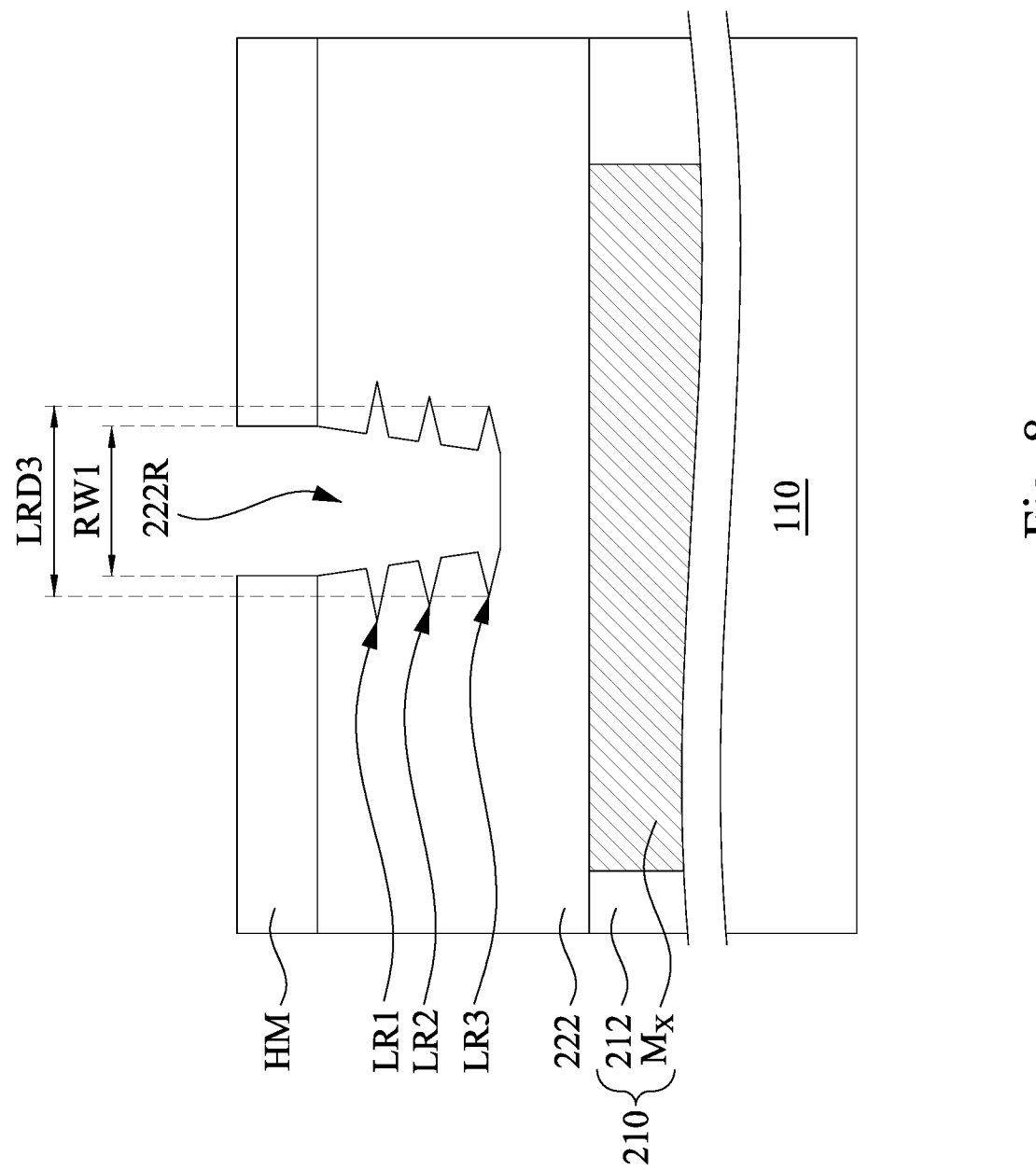

Reference is made to FIG. 8. After the vertical etching of the recess 222R (referring FIG. 7), a lateral recess LR3 is laterally etched on a sidewall of the recess 222R and at a position lower than the lateral recess LR2. In some embodiments, the lateral etching of the lateral recess LR3 may include a plasma isotropic etching process without substrate bias. This process can be performed in-situ immediately following the plasma anisotropic etching process depicted in FIG. 7, which in turn allows the plasma isotropic etching process to be benefited from the non-uniform ion distribution caused by the previous plasma anisotropic etching process. In greater detail, because the lower region of the recess 222R has more ions than the upper region of the recess 222R as a consequence of the ion bombardment in the vertically etching of the recess 222R (referring to FIG. 7), the lateral recess LR3 is etched at a lower region of a sidewall of the recess 222R by plasma, rather than at an upper region of the sidewall of the recess. In this way, the plasma isotropic etching process can etch the lower region of the sidewall of the recess 222R at a faster etch rate than etching the upper region of the sidewall of the recess 222R, which in turn results in a greater etching amount in the lower region of the sidewall of the recess 222R than in the upper region of the sidewall of the recess 222R. As a result, the lateral recess LR3 may be localized to the lower region of the sidewall of the recess 222R. The lateral recess LR3 may laterally encircle the recess 222R. As the lateral recess LR1 in FIG. 4B, the lateral recess LR3 may have an annular shape around the recess 222R in a plane view. In some embodiments, the lateral recess LR3 may extend into the dielectric layer 222 beyond a top width RW1 of the recess 222R. For example, a greatest lateral dimension/length LRD3 of the annular shape of the lateral recess LR3 is greater than a top width RW1 of the recess 222R. After the lateral etching of the lateral recess LR3, the metallization layer M$_x$ remains covered by the dielectric layer 222. The recess 222R may also be slightly expanded by the plasma isotropic etching process in the lateral etching of the lateral recess LR3, and the lateral recesses LR1 and LR2 may also be further laterally deepened by the plasma isotropic etching process in the lateral etching of the lateral recess LR3. For example, a size/width of the recess 222R (e.g., the top width RW1), the greatest lateral dimension/length LRD1 of the lateral recess LR1 (referring to FIG. 4A), and the greatest lateral dimension/length LRD2 of the lateral recess LR2 (referring to FIG. 6) may get increased after the lateral etching of the lateral recess LR3.

Figure 9:
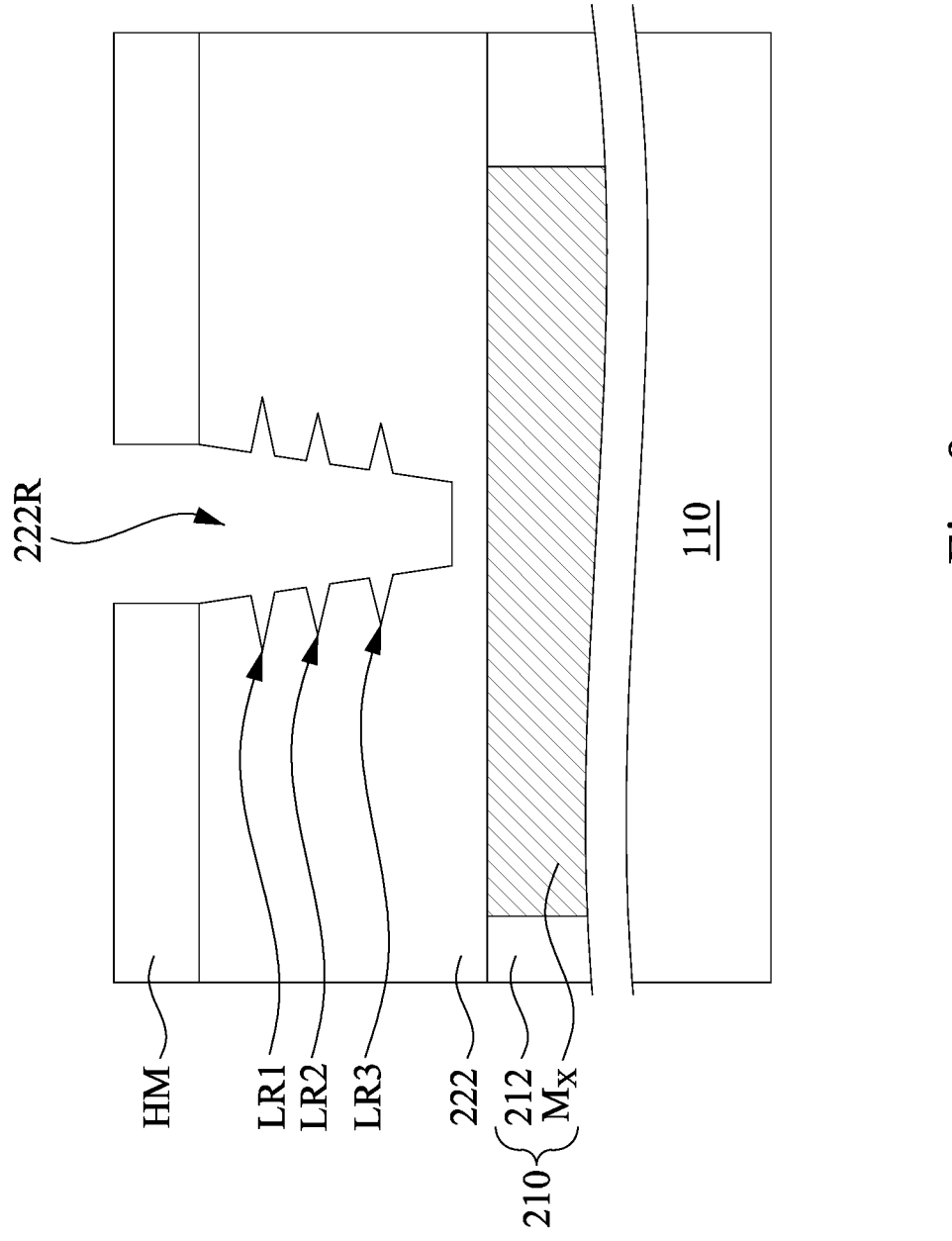

Reference is made to FIG. 9. The recess 222R in FIG. 8 is vertically etched downward in the dielectric layer 222 to a third level lower than the second level in FIG. 7 but higher than the top surface of the metallization layer M$_x$. The vertical downward etching may use the hard mask layer HM as an etch mask. In some embodiments, the vertical downward etching of the recess 222R may include an in-situ plasma anisotropic etching process with substrate bias. The plasma anisotropic etching process may include the process of removing materials of the dielectric layer 222 by exposing the dielectric layer 222 to an ion bombardment. As aforementioned, ion bombardment precipitates ions at the bottom of the recess 222R because of high electric field resulting from the substrate bias. Stated differently, the plasma ions and the substrate bias result in a synergistic effect in collecting more ions at a lower region of the recess 222R than at an upper region of the recess 222R.

Figure 10:
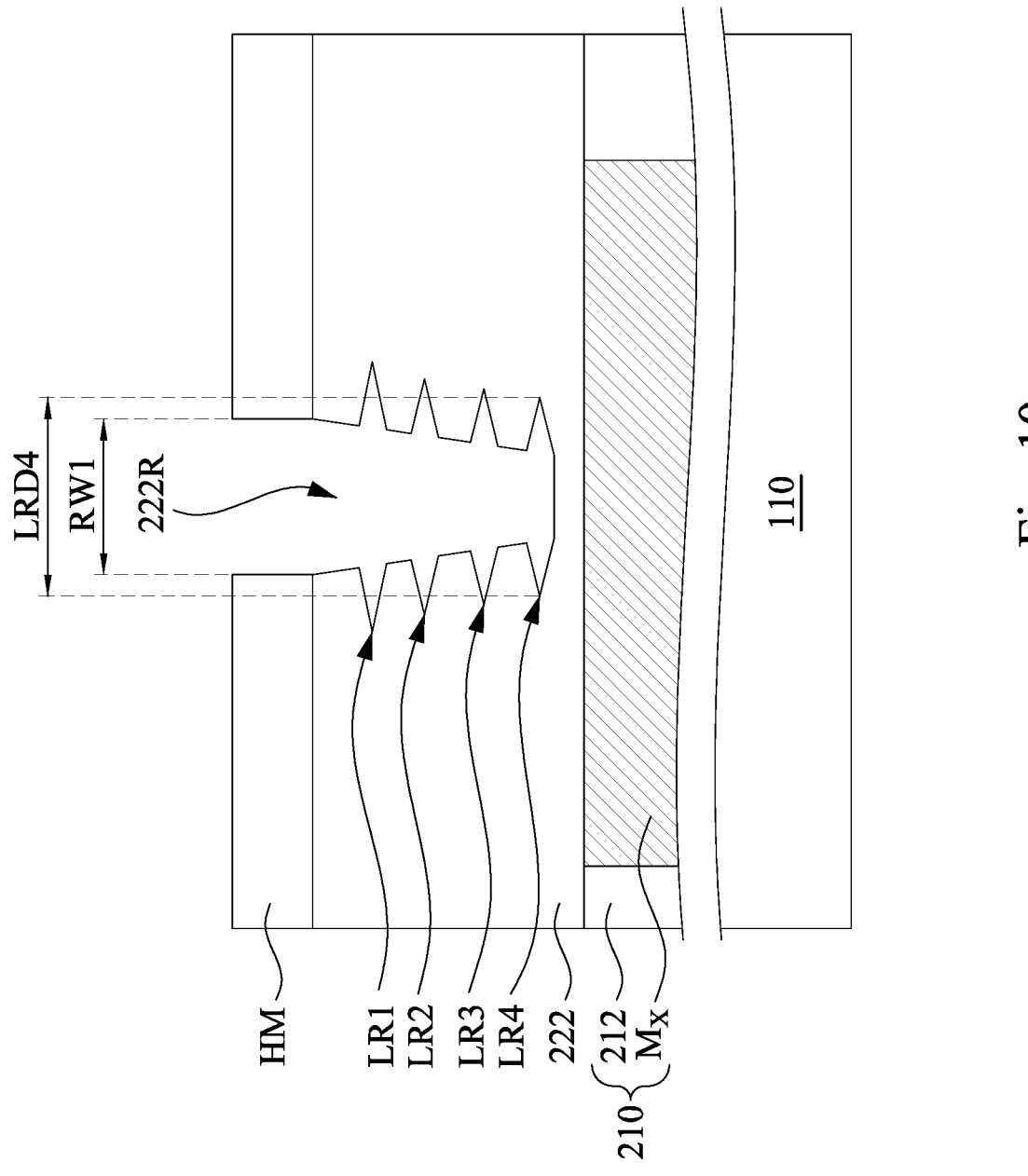

Reference is made to FIG. 10. After the vertical etching of the recess 222R (referring FIG. 9), a lateral recess LR4 is laterally etched on sidewall of the recess 222R and at a position lower than the lateral recess LR3. In some embodiments, the lateral etching of the lateral recess LR4 may include a plasma isotropic etching process without substrate bias. This process can be performed in-situ immediately following the plasma anisotropic etching process depicted in FIG. 9, which in turn allows the plasma isotropic etching process to be benefited from the non-uniform ion distribution caused by the previous plasma anisotropic etching process. In greater detail, because the lower region of the recess 222R has more ions than the upper region of the recess 222R as a consequence of the ion bombardment in the vertically etching of the recess 222R (referring to FIG. 9), the lateral recess LR4 is etched at a lower region of a sidewall of the recess 222R by plasma, rather than at an upper region of the sidewall of the recess. In this way, the plasma isotropic etching process can etch the lower region of the sidewall of the recess 222R at a faster etch rate than etching the upper region of the sidewall of the recess 222R, which in turn results in a greater etching amount in the lower region of the sidewall of the recess 222R than in the upper region of the sidewall of the recess 222R. As a result, the lateral recess LR4 may be localized to the lower region of the sidewall of the recess 222R. The lateral recess LR4 may laterally encircle the recess 222R. As the lateral recess LR1 in FIG. 4B, the lateral recess LR4 may have an annular shape around the recess 222R in a plane view. In some embodiments, the lateral recess LR4 may extend into the dielectric layer 222 beyond a top width RW1 of the recess 222R. For example, a greatest lateral dimension/length LRD4 of the lateral recess LR4 is greater than a top width RW1 of the recess 222R. After the lateral etching of the lateral recess LR4, the metallization layer $M_x$ remains covered by the dielectric layer 222. The recess 222R may also be slightly expanded by the plasma isotropic etching process in the lateral etching of the lateral recess LR4, and the lateral recesses LR1-LR3 may also be further laterally deepened by the plasma isotropic etching process in the lateral etching of the lateral recess LR4. For example, a size/width of the recess 222R (e.g., the top width RW1), the greatest lateral dimension/length LRD1 of the lateral recess LR1 (referring to FIG. 4A), the greatest lateral dimension/length LRD2 of the lateral recess LR2 (referring to FIG. 6), and the greatest lateral dimension/length LRD3 of the lateral recess LR3 (referring to FIG. 8) may get increased after the lateral etching of the lateral recess LR4.

Figure 11:
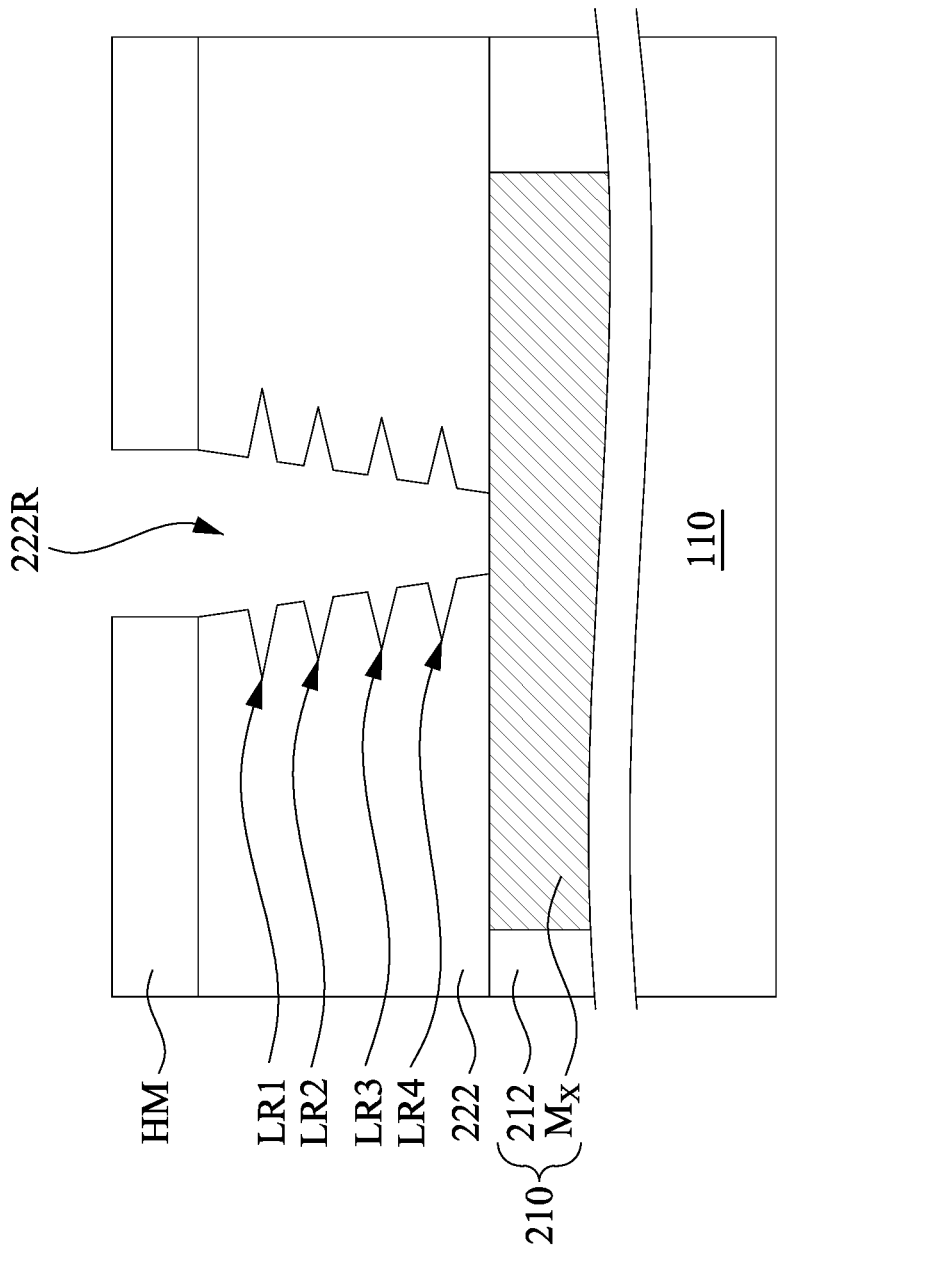

Reference is made to FIG. 11. The recess 222R in FIG. 10 is vertically etched downward in the dielectric layer 222 until the underlying metallization layer $M_x$ is exposed. The hard mask layer HM may serve as an etch mask during the vertical downward etching. In some embodiments, the vertical downward etching of the recess 222R may include an in-situ plasma anisotropic etching process with substrate bias. The plasma anisotropic etching process may include exposing the dielectric layer 222 to an ion bombardment for removing materials of the dielectric layer 222.

Degree of anisotropic etching can be described by a ratio of a vertical etching rate to a lateral etching rate, which is referred to as vertical-to-lateral etch rate ratio herein. In above steps, the vertical downward etching of the recess 222R (referring to FIGS. 3, 5, 7, 9, 11) may be performed with a first vertical-to-lateral etch rate ratio, and the lateral etching of the lateral recesses LR (referring to FIGS. 4A, 6, 8, 10) may be performed with a second vertical-to-lateral etch rate ratio less than the first vertical-to-lateral etch rate ratio. For example, in some embodiments, The first vertical-to-lateral etch rate ratio may be in a range from about 2 to about 200 for showing characteristics of anisotropic etching, while the second vertical-to-lateral etch rate ratio may be in a range from about 0.5 to about 1.5 for showing characteristics of isotropic etching. In some other embodiments, depending on device requirements, the first and second vertical-to-lateral etch rate ratios can be other numerical ranges for respectively showing characteristics of anisotropic etching and isotropic etching.

As aforementioned above, the plasma etching apparatus may include a RF power source for biasing the substrate 110 during plasma etching. The RF power source may operate at a suitable frequency, such as several MHz. By adjusting the power of the RF power source in plasma etching apparatus, the cyclic repetition of anisotropic dry etching (in FIGS. 3, 5, 7, 9, 11) and the isotropic dry etching (in 4A, 6, 8, 10) can be achieved. For example, the anisotropic etching can be performed using a RF bias power in a range from about 100 Watts to about 700 Watts, and the isotropic etching can be performed using a RF bias power in a range from about 0 Watt to about 10 Watts, less than that of the anisotropic etching. The ranges of the RF power for the anisotropic etching and the isotropic etching can vary depending on device requirements. If the RF bias power of the anisotropic etching is less than 100 Watts, etching process may suffer from lateral etch. If the RF bias power of the anisotropic etching is greater than 700 Watts, the dielectric layer 222 may be vertically etched too soon to control the vertical distribution of the lateral recesses LR1. LR2, LR3, LR4. If the RF bias power of the isotropic etching is greater than 10 Watts, the lateral recesses LR1. LR2. LR3, LR4 may not form the screw-like shape.

Through the steps in FIGS. 3-11, a skew-like via opening including the recess 222R and plural lateral recesses LR is formed. It is noted that four lateral recesses LR, such as lateral recess LR1-LR4 are designed as illustrated in FIG. 11. It can be appreciated that any number of lateral recesses LR can be formed on a sidewall of the recess 222R. In some embodiments, the number of lateral recesses LR is between 1 and 5. If the lateral recesses LR is greater than 5, two lateral recesses LR may touch each other due to process fabrication limitation. In some embodiments, a size/width of the lateral recesses LR may decrease from top to down since the lateral recesses LR may experience different numbers of isotropic etching. For example, the lateral recess LR1 experiences four isotropic etchings, the lateral recess LR2 experiences three isotropic etchings, the lateral recess LR3 experiences two isotropic etchings, and the lateral recess LR4 experiences one isotropic etching. Thus, a size/width of the lateral recess LR1 is greater than a size/width of the lateral recess LR2, a size/width of the lateral recess LR2 is greater than a size/width of the lateral recess LR3, and a size/width of the lateral recess LR3 is greater than a size/width of the lateral recess LR4.

In some embodiments, the lateral recesses LR1, LR2, LR3, and LR4 are evenly distributed in the dielectric layer 222 along a vertical direction normal to a top surface of the substrate 110. For example, a vertical distance VD1 between the lateral recesses LR1 and LR2, a vertical distance VD2 between the lateral recesses LR2 and LR3, and a vertical distance VD3 between the lateral recesses LR3 and LR4 are substantially the same. In some alternative embodiments, the lateral recesses LR1, LR2, LR3, and LR4 may be non-evenly distributed along the vertical direction. For example, at least two of the vertical distance VD1 between the lateral recesses LR1 and LR2, the vertical distance VD2 between the lateral recesses LR2 and LR3, and the vertical distance VD3 between the lateral recesses LR3 and LR4 are different. For example, the vertical distance VD2 between the lateral recesses LR2 and LR3 may be less than the vertical distance VD1 between the lateral recesses LR1 and LR2 and/or the vertical distance VD3 between the lateral recesses LR3 and LR4. In the figures, the dash lines may indicate the planes that the lateral recesses LR extend into the dielectric layer 222 substantially along. For example, the lateral recesses LR may have a greatest cross-sectional area at the dashed lines. And, the vertical distances are measured from the dashed lines.

Figure 12:
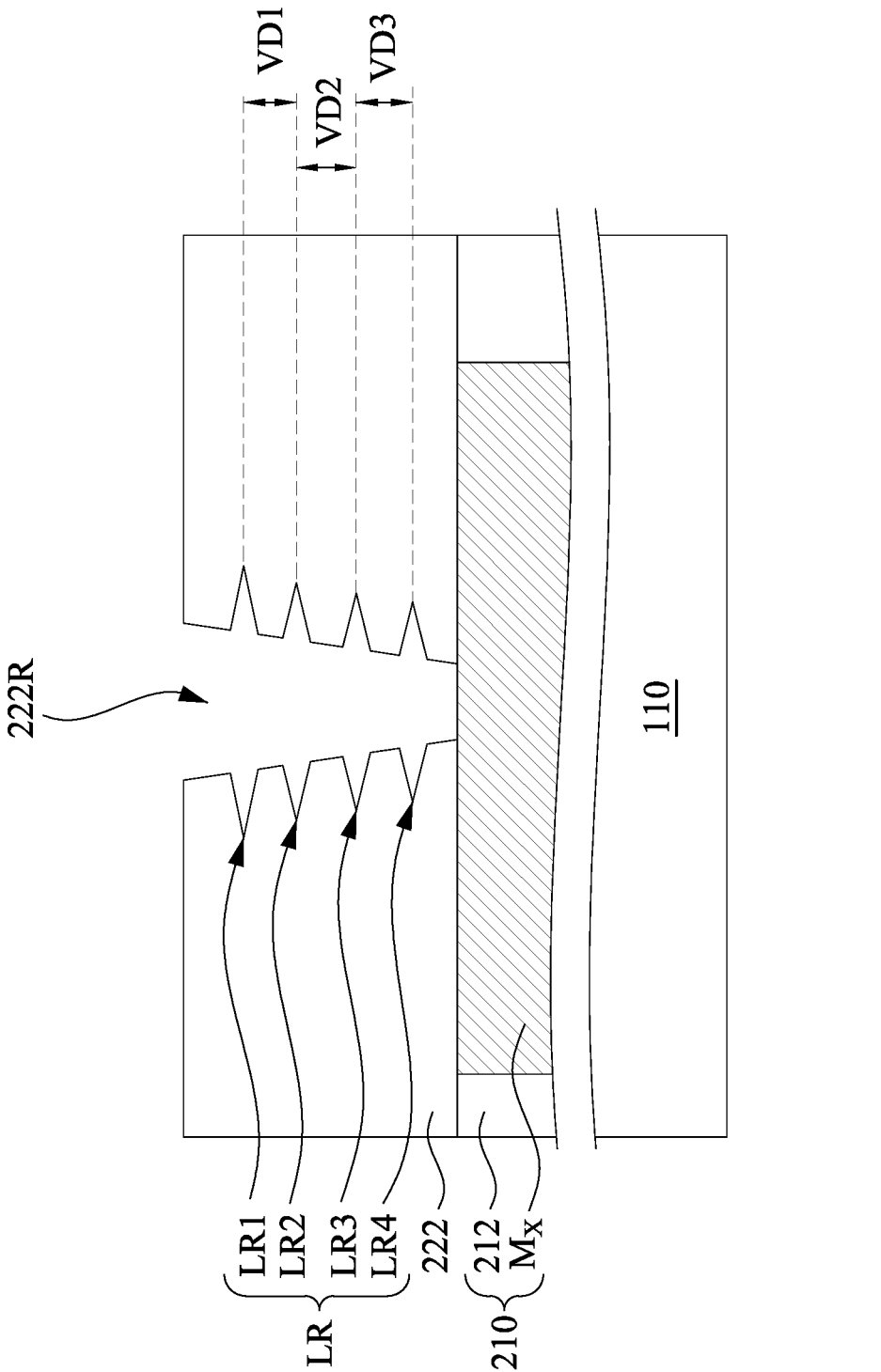

Reference is made to FIG. 12. A wet clean process is performed to remove the hard mask layer HM from the dielectric layer 222. The wet clean process may use a suitable liquid that can remove the hard mask layer HM and does not substantially damage the dielectric layer 222.

Figure 13:
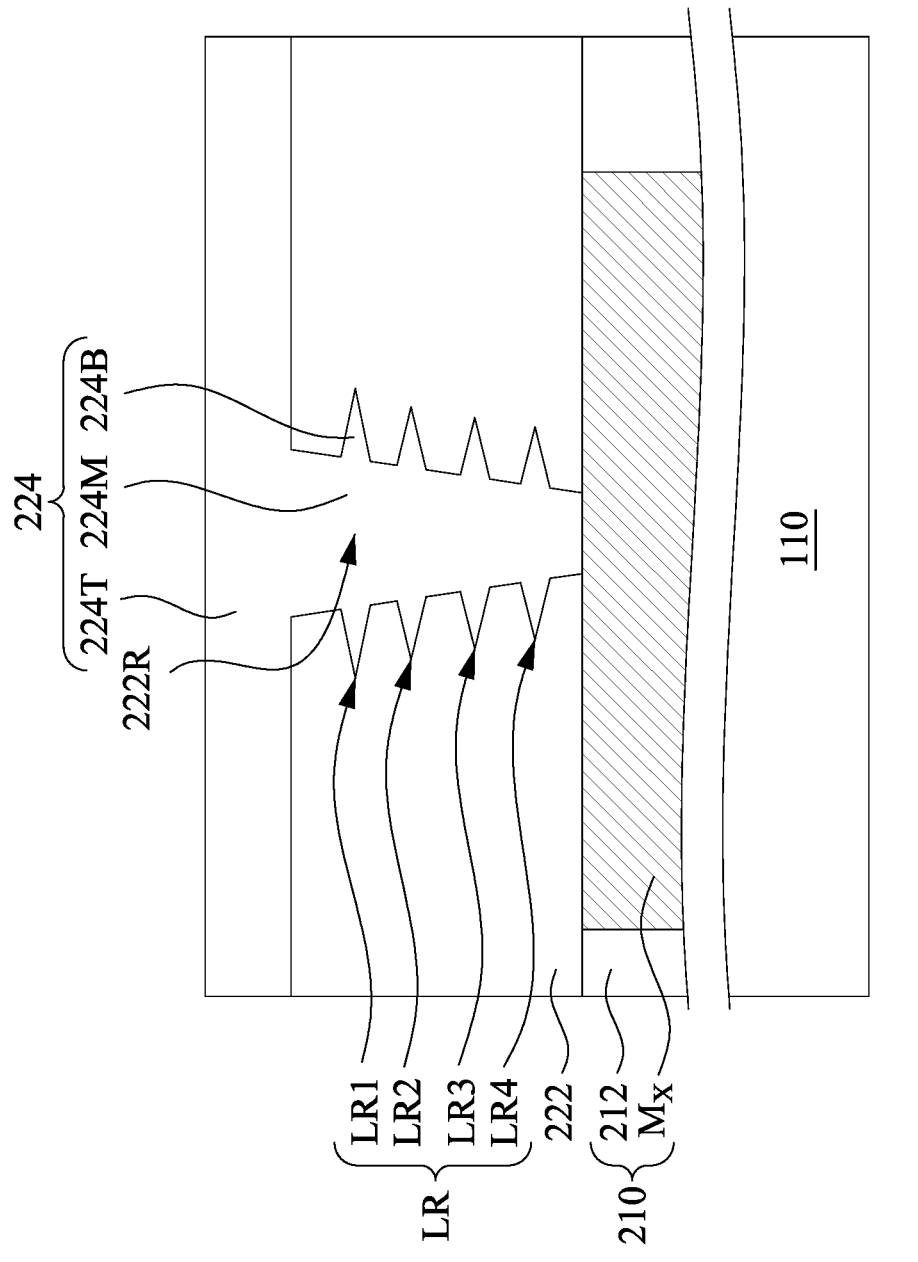

Reference is made to FIG. 13. A conductive layer 224 is deposited to fill up the recess 222R and the lateral recesses LR (e.g., lateral recesses LR1-LR4). The conductive layer 224 may include a main portion 224M in the recess 222R, plural branch portions 224B in the lateral recesses LR, and a top portion 224T over the top surface of the dielectric layer 222. The conductive material of the conductive layer 224 may be copper, although other materials, such as tungsten, aluminum, gold, or the like, can alternatively be utilized. The conductive layer 224 can be deposited by suitable physical vapor deposition process, electroplating techniques, the like, or the combination thereof.

Figure 14:
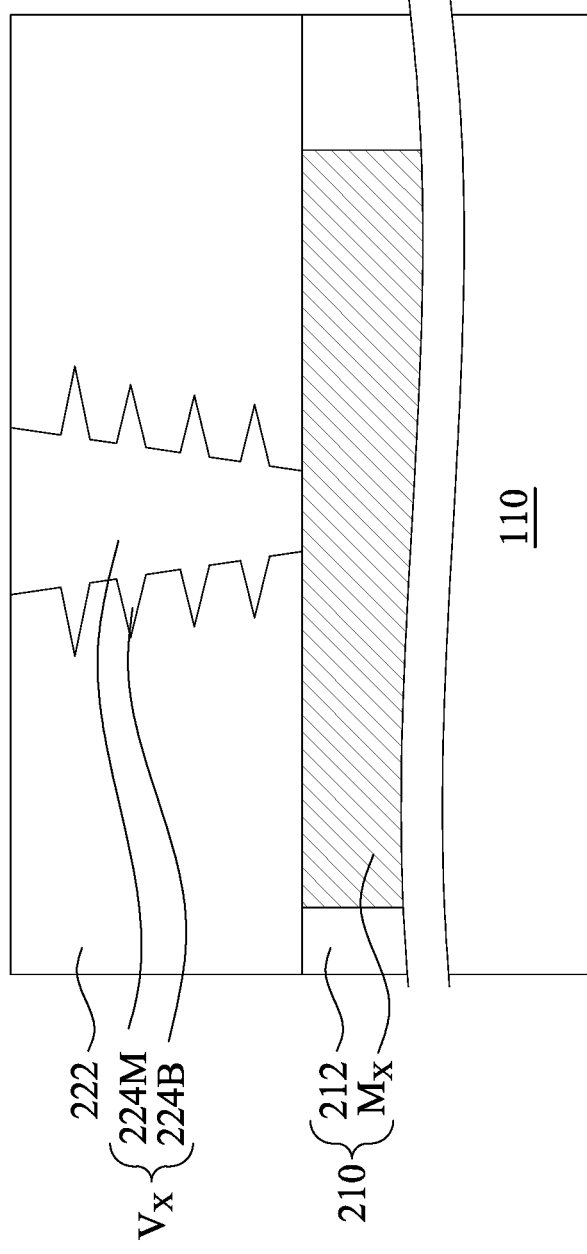

Reference is made to FIG. 14. A planarization process (e.g., chemical mechanical polish (CMP) process) is performed to remove the top portion 224T of the conductive layer 224 that is external to the recess 222R. The remaining main portion 224M and the remaining branch portions 224B form a conductive via $V_x$ over the metallization layer $M_x$.

Figure 15:
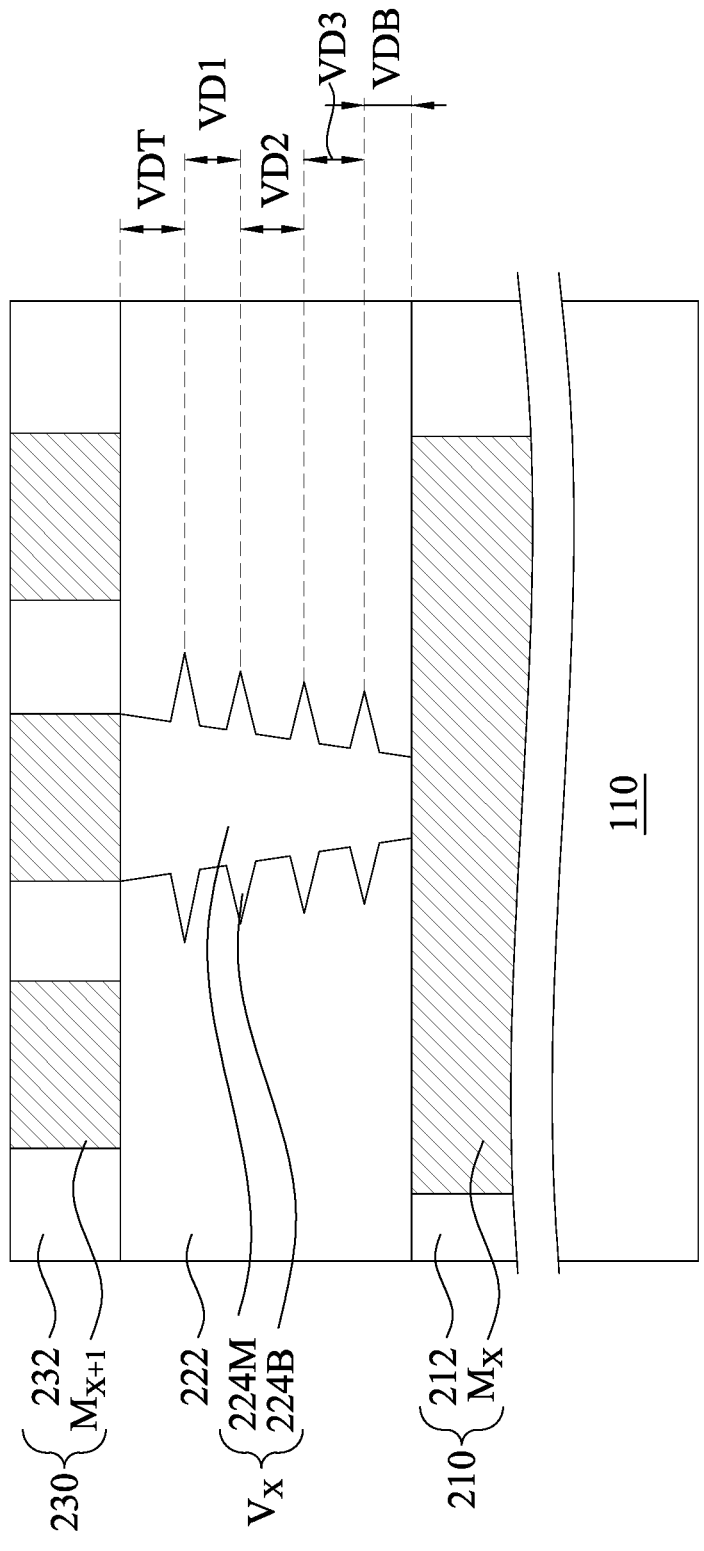

Reference is made to FIG. 15. An interconnect layer 230 is formed over the dielectric layer 222 and the conductive via $V_x$. The interconnect layer 230 includes a metallization layer $M_{x+1}$ and a dielectric layer 232 surrounded the metallization layer $M_{x+1}$. Formation of the interconnect layer 230 include depositing the dielectric layer 232 over the dielectric layer 222 and the conductive via $V_x$, etching trenches in the dielectric layer 232 to expose the conductive via $V_x$, depositing a conductive material into the trenches, followed by a planarization process (e.g., chemical mechanical polish (CMP) process) to remove an excess portion of the conductive material outside the trenches. Remaining portions of the conductive material serve as the metallization layer $M_{x+1}$.

The dielectric layer 232 may include may include suitable dielectric materials, such as TEOS, an extreme low-k (ELK) dielectric material, NFARC, silicon oxide, silicon nitride, silicon oxynitride, PSG, BPSG, SOG, FSG, carbon doped silicon oxide (e.g., SiCOH), Xerogel, Aerogel, amorphous fluorinated carbon, parylene, BCB, polyimide, or any combination thereof. The ELK dielectric material has a dielectric constant less than, for example, about 2.5. The dielectric layer 232 may include the same dielectric materials as that of the dielectric layers 212 and 222, or different dielectric materials from that of the dielectric layers 212 and 222. It is understood that the dielectric layer 232 may include one or more dielectric materials and/or one or more dielectric layers. In some embodiments, the dielectric layer 232 may be deposited by CVD, HDP CVD, SACVD, spin-on coating, sputtering, or other suitable techniques.

In some embodiments, the metallization layer $M_{x+1}$ includes conductive lines extending horizontally in the dielectric layer 232. The conductive material of the metallization layer $M_{x+1}$ may be copper, although other materials, such as tungsten, aluminum, gold, or the like, can alternatively be utilized. The conductive material of the metallization layer $M_{x+1}$ may can be deposited by suitable physical vapor deposition process, electroplating techniques, the like, or the combination thereof.

The main portion 224M of the conductive via $V_x$ connects the metallization layer $M_{x+1}$ to the underlying metallization layer $M_x$. Thus, a multi-level interconnect (MLI) including the metallization layer $M_x$, the conductive via $V_x$, and the metallization layer $M_{x+1}$ is formed over the substrate 110. The branch portions 224B of conductive via $V_x$ extend laterally from a sidewall of the main portion 224M of the conductive via $V_x$. The branch portions 224B of conductive via $V_x$ may taper away from the main portion 224M of the conductive via $V_x$. In some embodiments, the branch portions 224B of conductive via $V_x$ are evenly distributed between the interconnect layers 210 and 230 along a vertical direction normal to a top surface of the substrate 110. For example, a vertical distance VDT between the topmost branch portion 224B and the metallization layer $M_{x+1}$, vertical distances VD1, VD2, VD3 between the branch portions 224B, and a vertical distance VDB between the bottommost branch portion 224B and the metallization layer $M_x$ are substantially the same. In some other embodiments, at least two of the vertical distance VDT between a topmost branch portion 224B and the metallization layer $M_{x+1}$, the vertical distances VD1, VD2, VD3 between the branch portions 224B, and the vertical distance VDB between a bottommost branch portion 224B and the metallization layer $M_x$ are different. In some embodiments, for spacing the branch portions 224B from the metallization layer $M_{x+1}$, the vertical distances VD1, VD2, VD3 between the branch portions 224B are less than the vertical distance VDT between a topmost branch portion 224B and the metallization layer $M_{x+1}$. In some embodiments, for spacing the branch portions 224B from the metallization layer $M_x$, the vertical distances VD1, VD2, VD3 between the branch portions 224B are less than the vertical distance VDB between a bottommost branch portion 224B and the metallization layer $M_x$.

In some embodiments of the present disclosure, by designing the conductive via $V_x$ to have the screw-like shape, the conductive via $V_x$ has a greater volume, thereby reducing its electrical resistance, thereby boosting the device. Furthermore, the conductive via $V_x$ having the screw-like shape is more tightly fixed to the dielectric layer 222, thereby addressing the via pullback issues occurs in later fabrication process (e.g., some thermal treatments).

Figure 16:
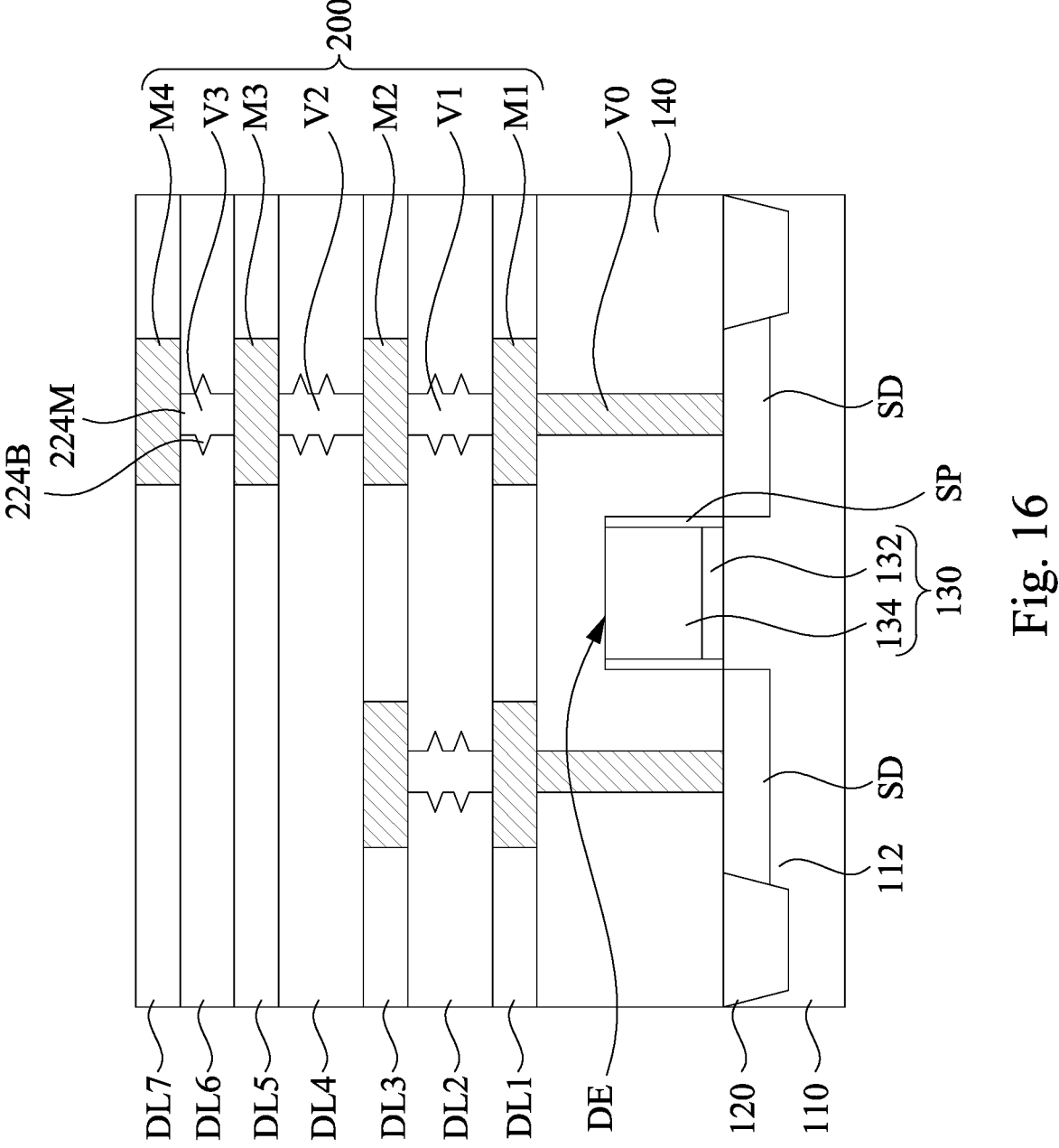
FIG. 16 is a cross-sectional view of an integrated circuit device including an interconnect structure according to some embodiments of the present disclosure.

FIG. 16 is a cross-sectional view of an integrated circuit device including an interconnect structure according to some embodiments of the present disclosure. One or more active and/or passive devices DE are formed over the substrate 110, a FEOL interlayer dielectric (ILD) layer 140 is formed overlying the active and/or passive devices DE, and contact plugs V0 are formed in the ILD layer 140 to connect the active and/or passive devices DE. The interconnect structure 200 electrically interconnects the one or more active and/or passive devices DE to form functional electrical circuits. As depicted, the interconnect structure 200 is fabricated using four metallization layers, labeled as M1 through M4, with four layers of metallization vias or interconnects, labeled as V1 through V3. Each of the metallization layers M1-M4 may include plural conductive lines connected by interconnects V1-V3. Other embodiments may contain more or fewer metallization layers and a corresponding more or fewer number of vias. Also included in interconnect structure 200 is a plurality of dielectric layers. Dielectric layers, identified as dielectric layers DL1 through dielectric layers DL7 are depicted in FIG. 16. The dielectric layers DI may be referred to as inter-metal dielectric (IMD) or interlayer dielectric (ILD). The dielectric layers DL1-DL7 may provide electrical insulation as well as structural support for the various features of the integrated circuit device during many fabrication process steps.

In some embodiments, one of the metallization vias V1-V3 may correspond to the conductive via $V_x$ including the main portion 224M and branch portions 224B in FIG. 15, and two of the metallization layers M1-M4 neighboring said one of the metallization vias V1-V3 may correspond to the metallization layer $M_x$ and $M_{x+1}$ in FIG. 15. As aforementioned, by designing the conductive vias V1-V3 to have the screw-like shape, the conductive vias V1-V3 have a greater volume, thereby reducing its electrical resistance, thereby boosting the device. Furthermore, the conductive vias V1-V3 having the screw-like shape can be more tightly fixed to the dielectric layer DL2, DL4. DL3, thereby addressing the via pullback issues occurs in later fabrication process (e.g., some thermal treatments). In some embodiments, as the size/height of the conductive vias V1-V3 may decrease from bottom to top, the number of the branch portions 224B of the conductive vias V1-V3 may decrease from bottom to top. For example, the number of the branch portions 224B of the conductive via V3 is less than the number of the branch portions 224B of the conductive via V2/V3. In some embodiments, since the conductive vias V1 in the dielectric layer DL2 are formed by the same cyclic repetition of anisotropic etching and isotropic etching, the conductive vias V1 in the dielectric layer DL2 include the same cross-sectional profile in FIG. 16. For example, the number of the branch portions 224B of the left conductive via V1 is substantially equal to the number of the branch portions 224B of the right conductive via V1.

The one or more active and/or passive devices DE are illustrated as a single transistor in FIG. 16. For example, the device DE may include a gate structure 130 and source/drain regions SD over regions surrounded by shallow trench isolation (STI) regions 120. The gate structure 130 may include a gate dielectric layer 132 and a gate electrode 134 over the gate dielectric layer 132. The spacers SP may be formed on opposite sides of the gate structure 130. In some embodiments, the source and drain regions SD may be doped regions formed in the substrate 110. In some alternative embodiments, the source and drain regions SD may be epitaxial structures formed over the substrate 110. The one or more active and/or passive devices DE may include various N-type metal-oxide semiconductor (NMOS) and/or P-type metal-oxide semiconductor (PMOS) devices, such as transistors, capacitors, resistors, diodes, photo-diodes, fuses, and the like. It is appreciated that the above examples are provided for the purpose of illustration only and are not meant to limit the present disclosure in any manner. Other circuitry may be also formed as appropriate for a given application. Contact plugs V0 electrically couple the overlying interconnect structure 200 to the underlying devices DE. In the example illustrated in FIG. 16, the contact plugs V0 make electrical connections to the source/drain regions SD of the device DE.

In some embodiments, one or more active and/or passive devices DE are formed the substrate 110. In the depicted embodiments, the devices DE are fin field-effect transistors (FinFET) that are three-dimensional MOSFET structure formed in fin-like strips of semiconductor protrusions referred to as fins 112. The cross-section shown in FIG. 16 is taken along a longitudinal axis of the fin 112 in a direction parallel to the direction of the current flow between the source/drain regions SD. The fin 112 may be formed by patterning the substrate 110 using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 112 by etching a trench into the substrate 110 using, for example, reactive ion etching (RIE). FIG. 16 illustrates a single fin 112, although the substrate 110 may comprise any number of fins. In some other embodiments, the devices DE can be planar transistors or gate-all-around (GAA) transistors. The GAA transistor may be fabricated by channel stacking techniques, and stacked nanosheet (NS) can enhance the Ion at fixed footprint.

STI regions 120 are formed on opposing sidewalls of the fin 112 as illustrated in FIG. 4A. STI regions 120 may be formed by depositing one or more dielectric materials (e.g., silicon oxide) to completely fill the trenches around the fins and then recessing the top surface of the dielectric materials. The dielectric materials of the STI regions 120 may be deposited using a high density plasma chemical vapor deposition (HDP-CVD), low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI regions 120 may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 120 such that an upper portion of fins 112 protrudes from surrounding insulating STI regions 120. In some cases, the patterned hard mask used to form the fins 112 may also be removed by the planarization process.

In some embodiments, a gate structure 130 of the FinFET device DE illustrated in FIG. 16 is a high-k, metal gate (HKMG) gate structure that may be formed using a gate-last process flow. In a gate-last process flow, a sacrificial dummy gate structure (not shown) is formed after forming the STI regions 120. The dummy gate structure may comprise a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structure may extend along multiple sides of the protruding fins and extend between the fins over the surface of the STI regions 120. As described in greater detail below, the dummy gate structure may be replaced by the HKMG gate structure 130 as illustrated in FIG. 16. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

In FIG. 16, source/drain regions SD and spacers SP of the transistor device DE are formed, for example, self-aligned to the dummy gate structures. Spacers SP may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers SP along the sidewalls of the dummy gate structures extending laterally onto a portion of the surface of the fin 112.

Source/drain regions SD are semiconductor regions in direct contact with the semiconductor fin 112. In some embodiments, the source/drain regions SD may comprise heavily-doped regions and relatively lightly-doped drain extensions, or LDD regions. Generally, the heavily-doped regions are spaced away from the dummy gate structures using the spacers SP, whereas the LDD regions may be formed prior to forming spacers SP and, hence, extend under the spacers SP and, in some embodiments, extend further into a portion of the semiconductor fin 112 below the dummy gate structure. The LDD regions may be formed, for example, by implanting dopants (e.g., As, P. B. In, or the like) using an ion implantation process.

The source/drain regions SD may comprise an epitaxially grown region. For example, after forming the LDD regions, the spacers SP may be formed and, subsequently, the heavily-doped source and drain regions may be formed self-aligned to the spacers SP by first etching the fins to form recesses, and then depositing a crystalline semiconductor material in the recess by a selective epitaxial growth (SEG) process that may fill the recess and may extend further beyond the original surface of the fin 112 to form raised source/drain epitaxy structures. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ $cm^{-2}$ to $10^{16}$ $cm^{-2}$) of dopants may be introduced into the heavily-doped source and drain regions D either in situ during SEG, or by an ion implantation process performed after the SEG, or by a combination thereof.

Once the source/drain regions SD are formed, a first ILD layer (e.g., lower portion of the ILD layer 140) is deposited over the source/drain regions SD. In some embodiments, a contact etch stop layer (CESL) (not shown) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the first ILD layer. The HKMG gate structures 130, illustrated in FIG. 16, may then be formed by first removing the dummy gate structures using one or more etching techniques, thereby creating recesses between respective spacers SP. Next, a replacement gate dielectric layer 132 comprising one more dielectrics, followed by a replacement gate metal layer 134 comprising one or more metals, are deposited to completely fill the recesses. Excess portions of the gate dielectric layer 132 and the gate metal layer 134 may be removed from over the top surface of first ILD using, for example, a CMP process. The resulting structure, as illustrated in FIG. 16, may include remaining portions of the gate dielectric layer 132 and the gate metal layer 134 inlaid between respective spacers SP.

The gate dielectric layer 132 includes, for example, a high-k dielectric material such as oxides and/or silicates of metals (e.g., oxides and/or silicates of Hf, Al, Zr, La, Mg. Ba, Ti, and other metals), silicon nitride, silicon oxide, and the like, or combinations thereof, or multilayers thereof. In some embodiments, the gate metal layer 134 may be a multilayered metal gate stack comprising a barrier layer, a work function layer, and a gate-fill layer formed successively on top of gate dielectric layer 132. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may comprise metals such as Cu, Al, W, Co, Ru, or the like, or combinations thereof, or multi-layers thereof. The materials used in forming the gate structure may be deposited by any suitable method, e.g., CVD, PECVD, PVD, ALD, PEALD, electrochemical plating (ECP), electroless plating and/or the like.

After forming the HKMG gate structure 130, a second ILD layer is deposited over the first ILD layer, and these ILD layers are in combination referred to as the ILD layer 140, as illustrated in FIG. 16. In some embodiments, the insulating materials to form the first ILD layer and the second ILD layer may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the first ILD layer and the second ILD layer may be deposited using any suitable method, such as CVD, PVD, ALD, PEALD, PECVD, SACVD, FCVD, spin-on, and/or the like, or a combination thereof.

The contact plugs V0 may be formed in the ILD layer 140 using photolithography, etching and deposition techniques. For example, a patterned mask may be formed over the ILD layer 140 and used to etch openings that extend through the ILD layer 140 to expose the source/drain region SD. Thereafter, conductive liner may be formed in the openings in the ILD layer 140. Subsequently, the openings are filled with a conductive fill material. The liner comprises barrier metals used to reduce out-diffusion of conductive materials from the contact plugs V0 into the surrounding dielectric materials. A conductive fill material (e.g., W. Al, Cu, Ru, Ni, Co, alloys of these, combinations thereof, and the like) may be deposited over the conductive liner layer to fill the contact openings, using any acceptable deposition technique (e.g., CVD, ALD, PEALD, PECVD, PVD, ECP, electroless plating, or the like, or any combination thereof). Next, a planarization process (e.g., CMP) may be used to remove excess portions of all the conductive materials from over the surface of the ILD 140. The resulting conductive plugs V0 extend into the ILD layer 140 and constitute contact plugs V0 making physical and electrical connections to the electrodes of electronic devices, such as the tri-gate FinFET device DE illustrated in FIG. 16. The interconnect structure 200 is then formed over the ILD layer 140 and the contact plugs V0. Details of the formation of the interconnect structure 200 are similar to those illustrated above, and therefore not repeated herein.

Figure 17:
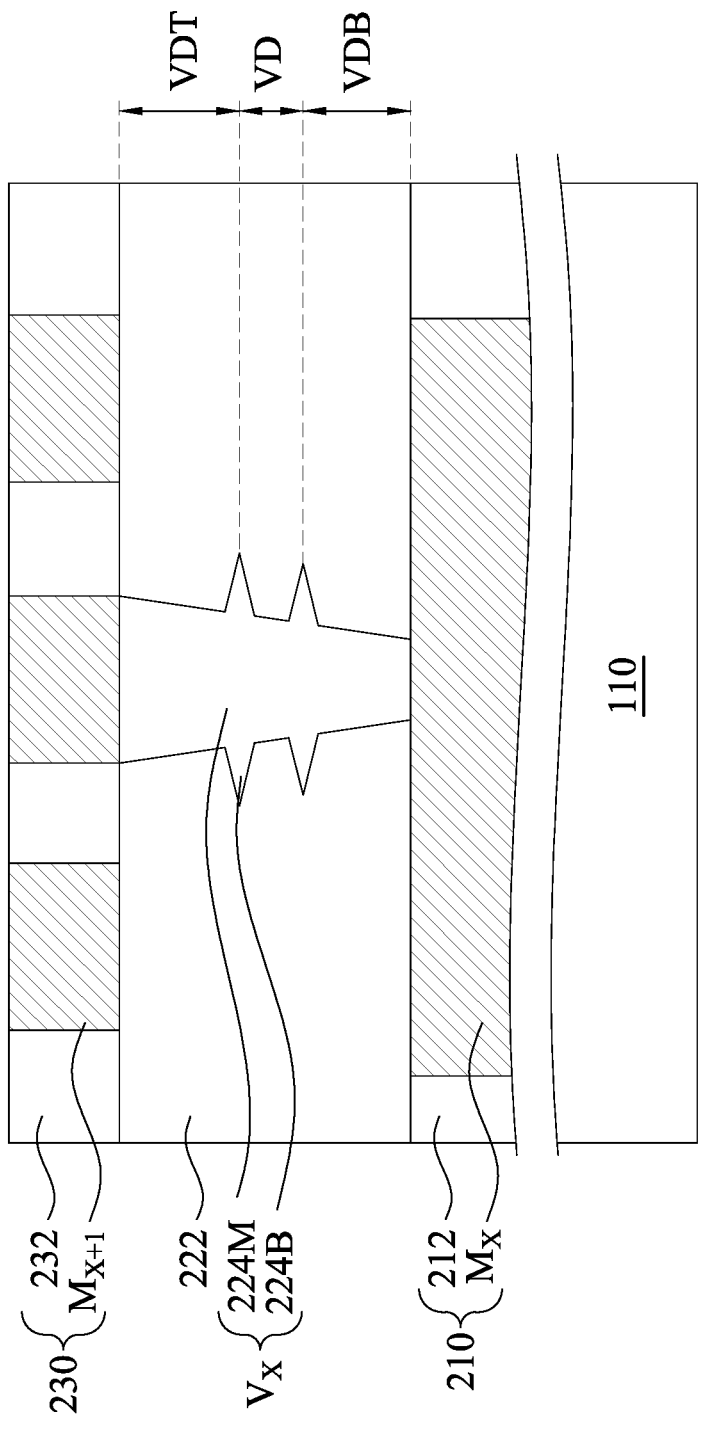
FIG. 17 is a cross-sectional view of an interconnection structure according to some embodiments of the present disclosure.

FIG. 17 is a cross-sectional view of an interconnection structure according to some embodiments of the present disclosure. Details of the present embodiments are similar to those illustrated in the embodiments of FIG. 15, except that the conductive via $V_x$ includes two branch portions 224B. The vertical distance VD between the two branch portions 224B is less than a vertical distance VDT between the topmost branch portion 224B and the metallization layer $M_{x+1}$, and also less than a vertical distance VDB between the bottommost branch portion 224B and the metallization layer $M_x$. Other details of the present embodiments are similar to those illustrated above, and thereto not repeated herein.

Figure 18:
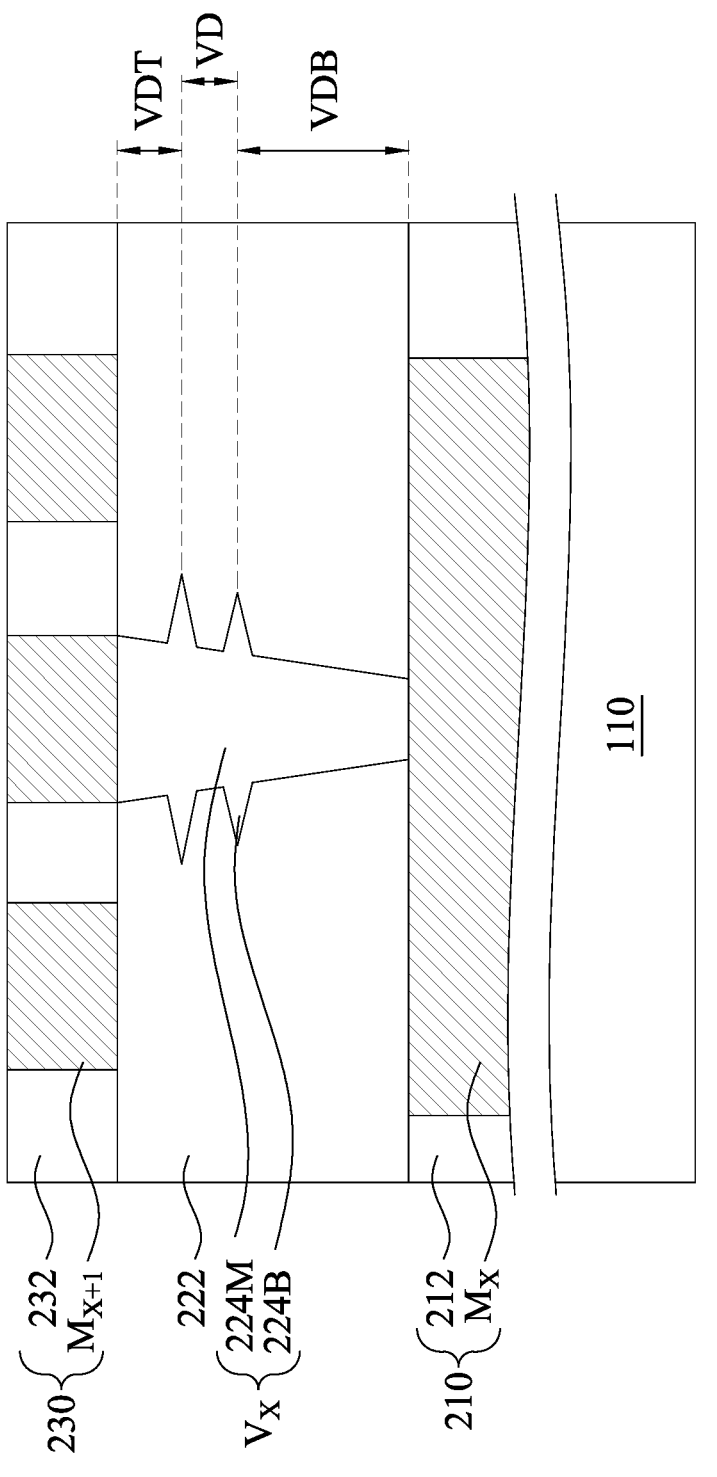
FIG. 18 is a cross-sectional view of an interconnection structure according to some embodiments of the present disclosure.

FIG. 18 is a cross-sectional view of an interconnection structure according to some embodiments of the present disclosure. Details of the present embodiments are similar to those illustrated in the embodiments of FIG. 15, except that the conductive via $V_x$ includes two branch portions 224B. The vertical distance VD between the two branch portions 224B is substantially equal to a vertical distance VDT between the topmost branch portion 224B and the metallization layer $M_{x+1}$, and less than a vertical distance VDB between the bottommost branch portion 224B and the metallization layer $M_x$. Other details of the present embodiments are similar to those illustrated above, and thereto not repeated herein.

Figure 19:
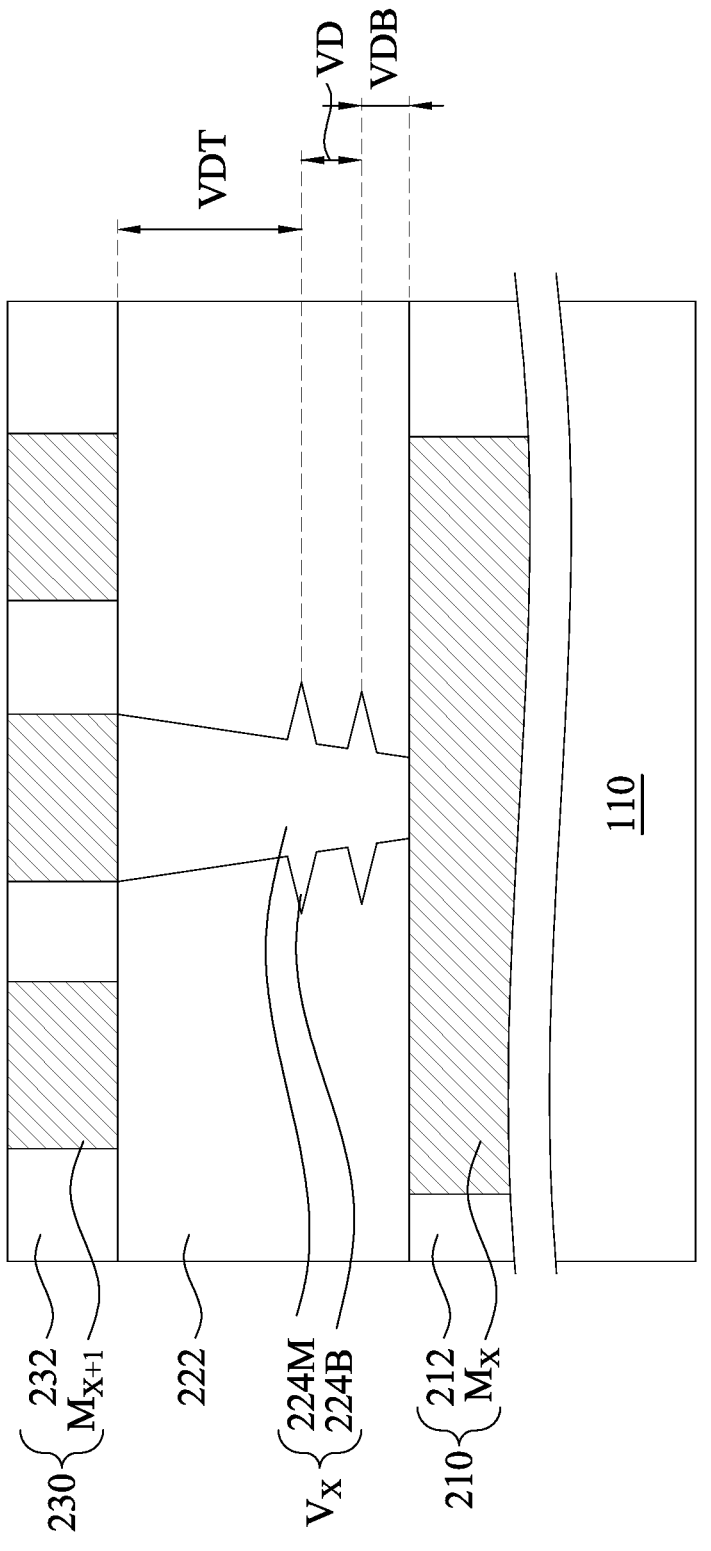
FIG. 19 is a cross-sectional view of an interconnection structure according to some embodiments of the present disclosure.

FIG. 19 is a cross-sectional view of an interconnection structure according to some embodiments of the present disclosure. Details of the present embodiments are similar to those illustrated in the embodiments of FIG. 15, except that the conductive via $V_x$ includes two branch portions 224B. The vertical distance VD between the two branch portions 224B is less than a vertical distance VDT between the topmost branch portion 224B and the metallization layer $M_{x+1}$, and substantially equal to a vertical distance VDB between the bottommost branch portion 224B and the metallization layer $M_x$. Other details of the present embodiments are similar to those illustrated above, and thereto not repeated herein.

Figure 20:
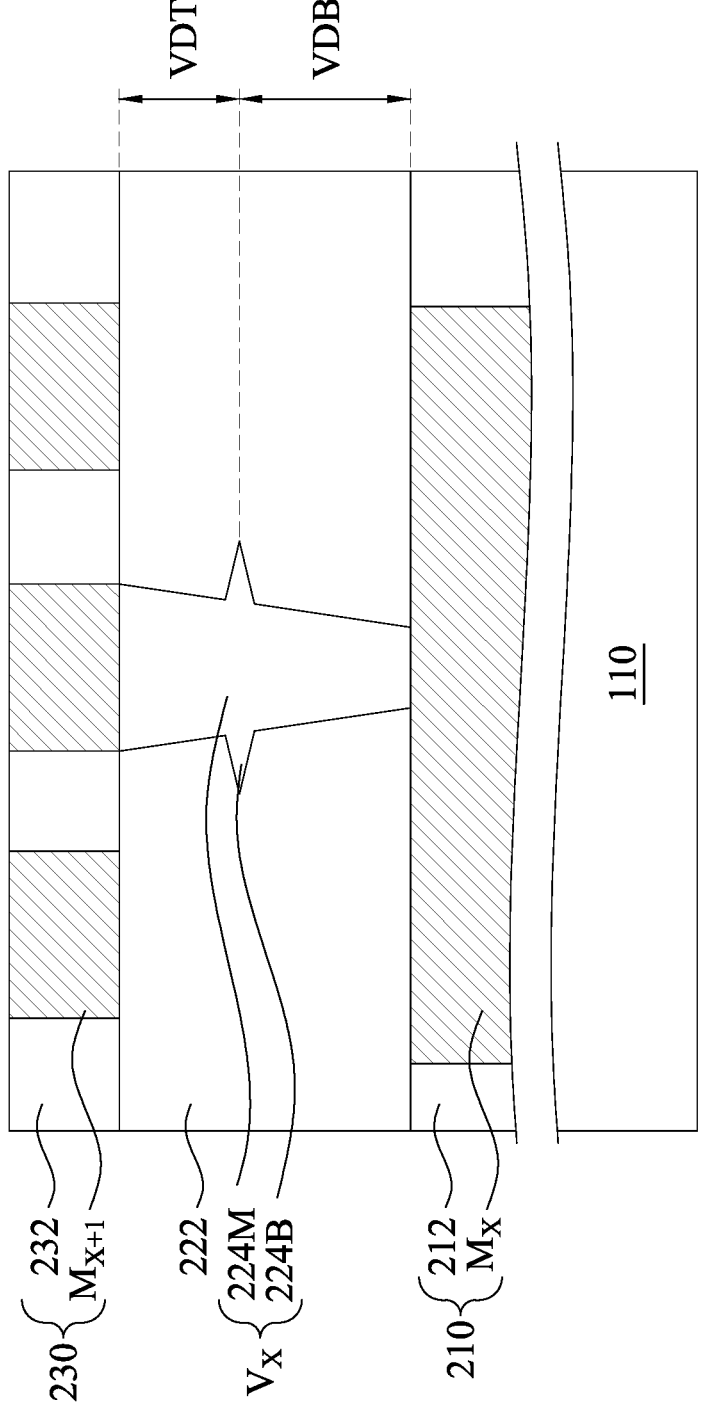
FIG. 20 is a cross-sectional view of an interconnection structure according to some embodiments of the present disclosure.

FIG. 20 is a cross-sectional view of an interconnection structure according to some embodiments of the present disclosure. Details of the present embodiments are similar to those illustrated in the embodiments of FIG. 15, except that the conductive via $V_x$ includes merely one branch portions 224B. In some embodiments, a vertical distance VDT between the branch portion 224B and the metallization layer $M_{x+1}$ may be substantially equal to a vertical distance VDB between the branch portion 224B and the metallization layer $M_x$. In some alternative embodiments, the vertical distance VDT between the branch portion 224B and the metallization layer $M_{x+1}$ may be greater or less than the vertical distance VDB between the branch portion 224B and the metallization layer $M_x$. Other details of the present embodiments are similar to those illustrated above, and thereto not repeated herein.

Based on the above discussions, it can be seen that the present disclosure offers advantages over interconnection structures. It is understood, however, that other embodiments may offer additional advantages, and not all advantages are necessarily disclosed herein, and that no particular advantage is required for all embodiments. One advantage is that by designing the conductive via $V_x$ to have the screw-like shape, the conductive via $V_x$ has a greater volume, thereby reducing its electrical resistance and boosting the device. Another advantage is that the conductive via $V_x$ having the screw-like shape is more tightly fixed to the dielectric layer 222, thereby addressing the via pullback issues occurs in later fabrication process (e.g., some thermal treatments).

According to some embodiments of the present disclosure, a method for forming an interconnection structure includes depositing a dielectric layer over a first interconnect layer, wherein the first interconnect layer comprises a first metallization layer; forming a via opening in the dielectric layer, wherein forming the via opening comprises: etching a recess in the dielectric layer above the first metallization layer; etching a first lateral recess in the dielectric layer at a sidewall of the recess; and after etching the first lateral recess, etching the recess downward to expose the first metallization layer; and forming a conductive via in the via opening.

According to some embodiments of the present disclosure, a method for forming an interconnection structure, comprising: depositing a dielectric layer over a first interconnect layer, wherein the first interconnect layer comprises a first metallization layer; forming a via opening in the dielectric layer above the first metallization layer, wherein forming the via opening comprises a plurality of repeating cycles, each of the cycles comprises an anisotropic dry etching process and an isotropic dry etching process; and forming a conductive via in the via opening.

According to some embodiments of the present disclosure, an interconnection structure includes a first interconnect layer, a second interconnect layer, and a conductive via. The first interconnect layer includes a first metallization layer. The second interconnect layer is above the second interconnect layer. The second interconnect layer comprises a second metallization layer. The conductive via is between the first interconnect layer and the second interconnect layer. The conductive via comprises a main portion and at least one branch portion, the main portion of the conductive via connects the second metallization layer to the first metallization layer, and the at least one branch portion of the conductive via extends laterally from a sidewall of the main portion of the conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an interconnection structure, comprising:

depositing a dielectric layer over a first interconnect layer, wherein the first interconnect layer comprises a first metallization layer;

forming a via opening in the dielectric layer, wherein forming the via opening comprises:

etching a recess in the dielectric layer above the first metallization layer;

etching a first lateral recess in the dielectric layer at a sidewall of the recess; and after etching the first lateral recess, etching the recess downward to expose the first metallization layer; and forming a conductive via in the via opening.

2. The method of claim 1, wherein etching the first lateral recess is performed such that the first metallization layer is covered by the dielectric layer.

3. The method of claim 1, wherein etching the first lateral recess is performed such that the first lateral recess extends laterally beyond a top width of the recess.

4. The method of claim 1, wherein etching the recess in the dielectric layer is performed with a first vertical-tolateral etch rate ratio, and etching the first lateral recess in the dielectric layer is performed with a second vertical-to-lateral etch rate ratio less than the first vertical-to-lateral etch rate ratio.

5. The method of claim 1, wherein forming the via opening further comprises:

after etching the first lateral recess, etching recess downward to a level higher than a top surface of the first metallization layer; and etching a second lateral recess in the dielectric layer at the sidewall of the recess after etching recess downward to the level.

6. The method of claim 5, wherein the second lateral recess is lower than the first lateral recess.

7. The method of claim 5, wherein etching the second lateral recess is performed such that the first lateral recess is further laterally deepened.

8. The method of claim 5, wherein etching the second lateral recess is performed such that a lateral dimension of the first lateral recess is greater than a lateral dimension of the second lateral recess.

9. The method of claim 1, wherein forming the conductive via comprises:

depositing a conductive material into the recess and the first lateral recess; and removing a portion of the conductive material external to the recess.

10. The method of claim 1, further comprising:

forming a second interconnect layer, wherein the second interconnect layer comprises a second metallization layer over the conductive via.

11. A method for forming an interconnection structure, comprising:

depositing a dielectric layer over a first interconnect layer comprising a first metallization layer;

forming a hard mask layer over the dielectric layer;

patterning the hard mask layer to form an opening exposing the dielectric layer;

etching a via opening in the dielectric layer using the hard mask layer as an etch mask, comprising:

etching a recess in the dielectric layer above the first metallization layer;

etching a first lateral recess in the dielectric layer at a sidewall of the recess;

after etching the first lateral recess, etching the recess downward to a level higher than a top surface of the first metallization layer;

after etching the recess downward to the level, etching a second lateral recess in the dielectric layer at the sidewall of the recess; and after etching the second lateral recess, etching the recess downward to expose the first metallization layer, wherein exposing the first metallization layer is performed after etching the first lateral recess;

removing the hard mask layer; and forming a conductive via in the via opening.

12. The method of claim 11, wherein etching the first lateral recess is performed such that the first metallization layer remains covered by the dielectric layer.

13. The method of claim 11, wherein etching the first lateral recess is performed such that the first lateral recess extends laterally beyond a top width of the recess.

14. The method of claim 11, wherein the hard mask layer is removed by a wet clean process after etching the via opening.

15. The method of claim 11, wherein forming the conductive via comprises:

depositing a conductive material into the recess, the first lateral recess and the second lateral recess; and removing a portion of the conductive material external to the recess.

16. A method for forming an interconnection structure, comprising:

depositing a dielectric layer over a first interconnect layer, wherein the first interconnect layer comprises a first metallization layer;

forming a patterned hard mask layer over the dielectric layer, wherein the patterned hard mask layer comprises an opening exposing the dielectric layer;

forming a via opening in the dielectric layer using the patterned hard mask layer as an etch mask, wherein forming the via opening comprises:

performing a first dry etching process to form a recess in the dielectric layer above the first metallization layer;

in-situ in a same plasma etching apparatus immediately after the first dry etching process, performing a second dry etching process to form a first lateral recess in the dielectric layer at a sidewall of the recess; and after forming the first lateral recess, etching the recess downward to expose the first metallization layer; and forming a conductive via in the via opening.

17. The method of claim 16, wherein the plasma etching apparatus is selected from a reactive ion etcher (RIE) and an inductively coupled plasma (ICP) etcher.

18. The method of claim 16, wherein:

the first dry etching process comprises an anisotropic dry etching process performed with substrate bias; and the second dry etching process comprises an isotropic dry etching process performed without substrate bias.

19. The method of claim 16, wherein the first lateral recess is localized to a lower region of a sidewall of the recess such that an upper region of the sidewall of the recess is free of the first lateral recess.

20. The method of claim 19, wherein the first lateral recess laterally encircles the recess to have an annular shape around the recess.

* * * * *